(12) United States Patent
Sohn

(10) Patent No.: US 7,135,900 B2
(45) Date of Patent: Nov. 14, 2006

(54) PHASE LOCKED LOOP WITH ADAPTIVE LOOP BANDWIDTH

(75) Inventor: Young-Soo Sohn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 45 days.

(21) Appl. No.: 11/082,497

(22) Filed: Mar. 17, 2005

(65) Prior Publication Data

US 2005/0225366 A1    Oct. 13, 2005

(30) Foreign Application Priority Data

Apr. 9, 2004    (KR) ...................... 10-2004-0024570

(51) Int. Cl.
*H03L 7/06*    (2006.01)
(52) U.S. Cl. ...................... 327/148; 327/157
(58) Field of Classification Search ................ 327/141, 327/147, 148, 154–157, 162–163; 331/10, 331/17, 25, DIG. 2; 375/373–376
See application file for complete search history.

(56) References Cited

U.S. PATENT DOCUMENTS

| | | | |
|---|---|---|---|
| 5,347,233 A | 9/1994 | Ishibashi et al. ............ 331/2 |
| 5,600,272 A | 2/1997 | Rogers ...................... 327/157 |
| 6,329,882 B1 | 12/2001 | Fayneh et al. .............. 331/10 |
| 6,456,165 B1 | 9/2002 | Kelkar ....................... 331/17 |
| 6,504,438 B1 | 1/2003 | Chang et al. ................ 331/17 |
| 6,570,423 B1 | 5/2003 | Trivedi et al. .............. 327/157 |
| 6,611,161 B1 | 8/2003 | Kumar et al. ............... 327/157 |
| 6,664,826 B1 * | 12/2003 | Creed et al. ................ 327/147 |

OTHER PUBLICATIONS

Sidiropoulos, Stefanos, et al., "Adaptive Bandwidth DLLs and PLLs using Regulated Suuply CMOS Buffers," Rambus Inc and Stanford University, 2000 Symposium on VLSI Circuits Digest of Technical Papers, pp. 124-7.

* cited by examiner

*Primary Examiner*—Linh My Nguyen
(74) *Attorney, Agent, or Firm*—Mills & Onello LLP

(57) ABSTRACT

A semiconductor device that includes an adaptive phase locked loop with improved loop stability and a faster locking rate. In one embodiment, this is accomplished in a manner that does not require an additional second charge pump for loop stability, and therefore the resulting phase locked loop of the present invention consumes less chip die area. In another embodiment, multiple charge pumps are used and the resulting response time for locking is improved over that which can be achieved by conventional embodiments.

47 Claims, 22 Drawing Sheets

FIG. 13A_1
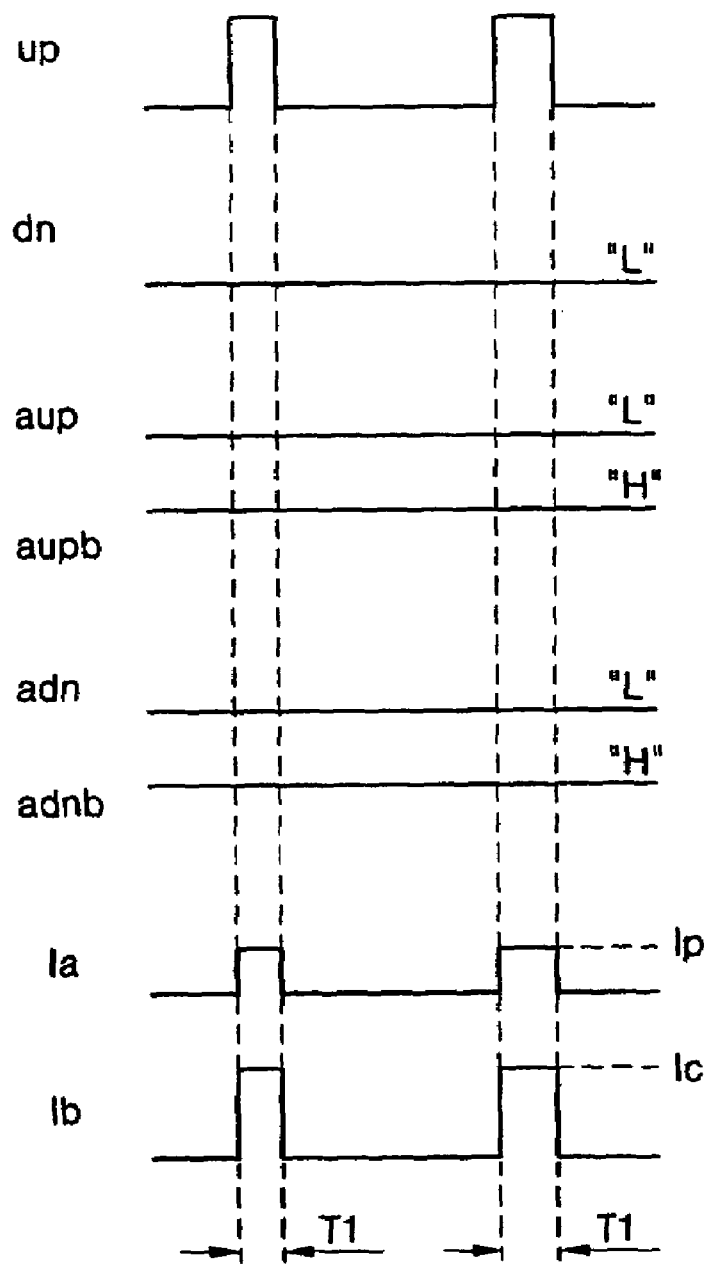

FIG. 13A_2
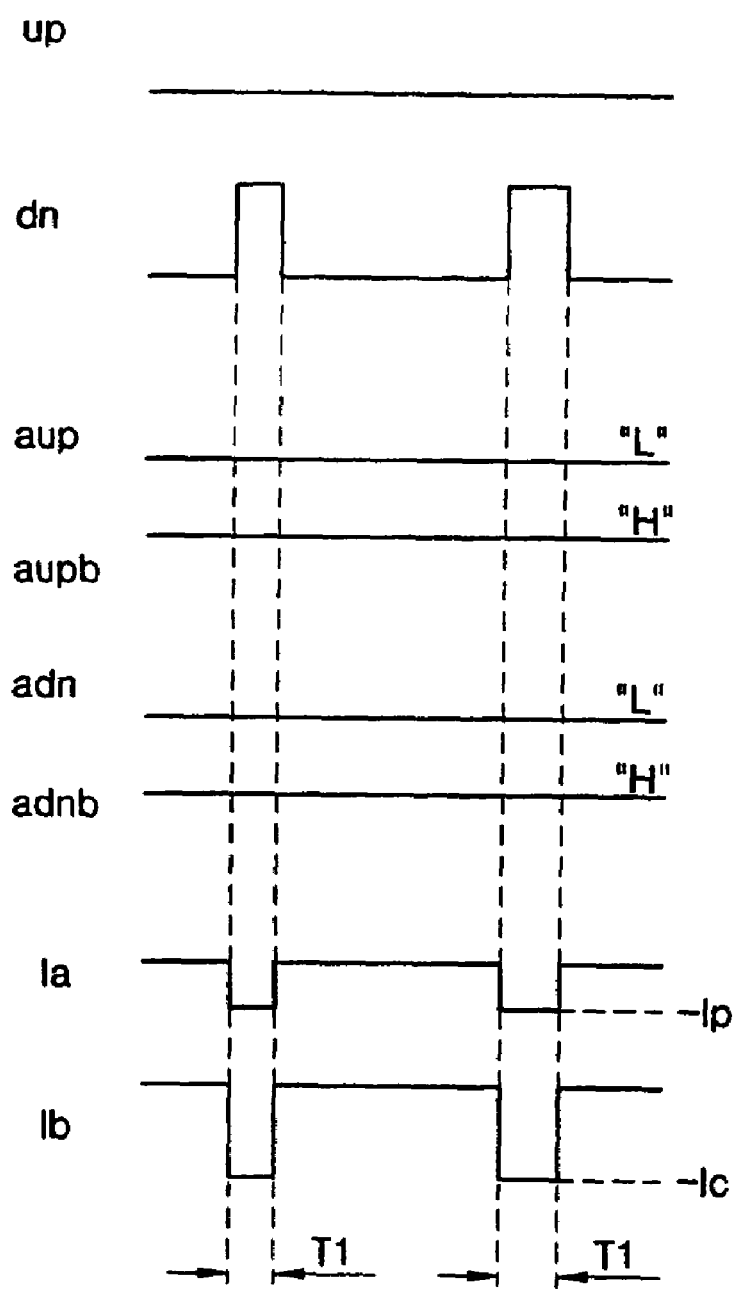

FIG. 13B_1
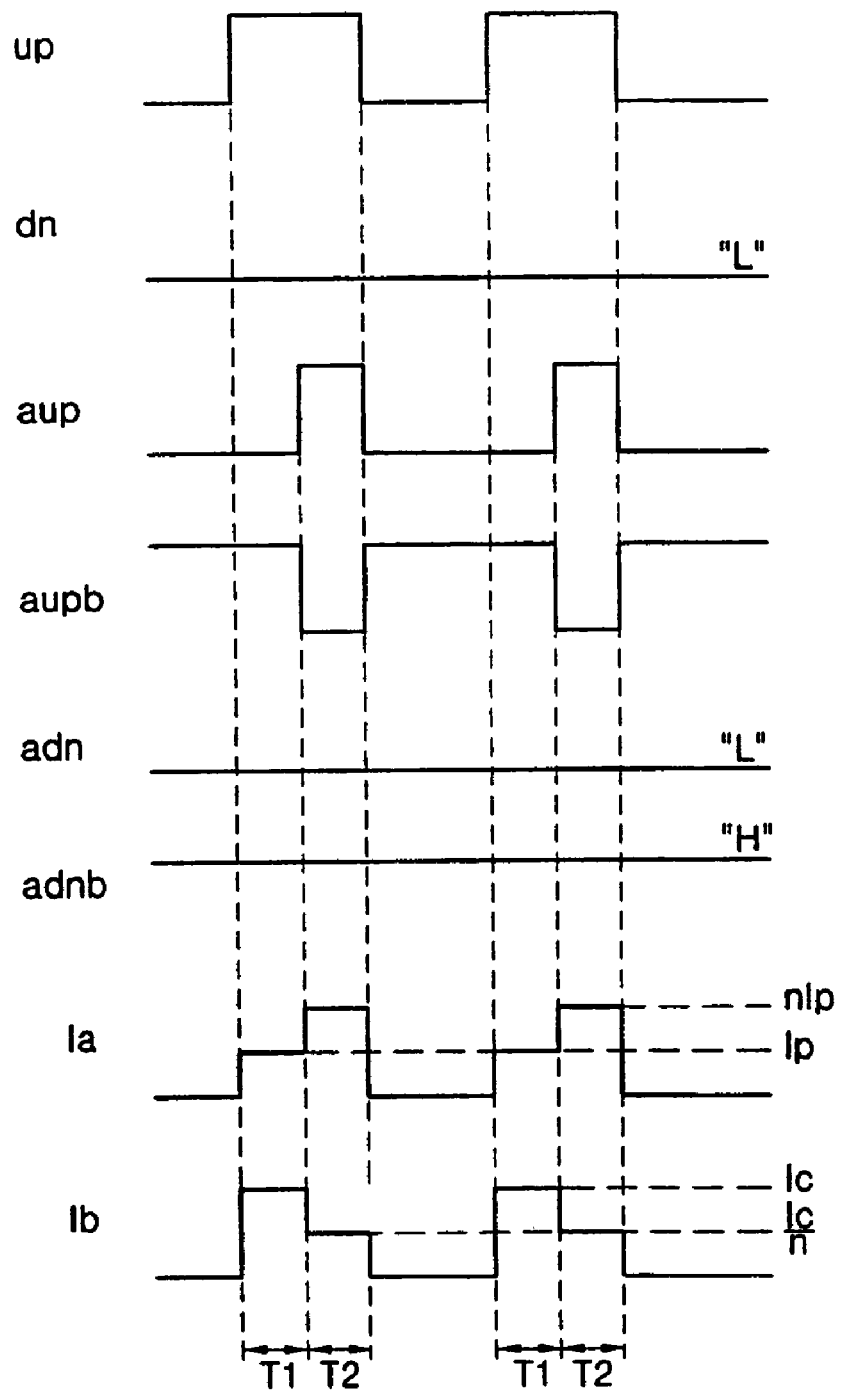

FIG. 13B_2
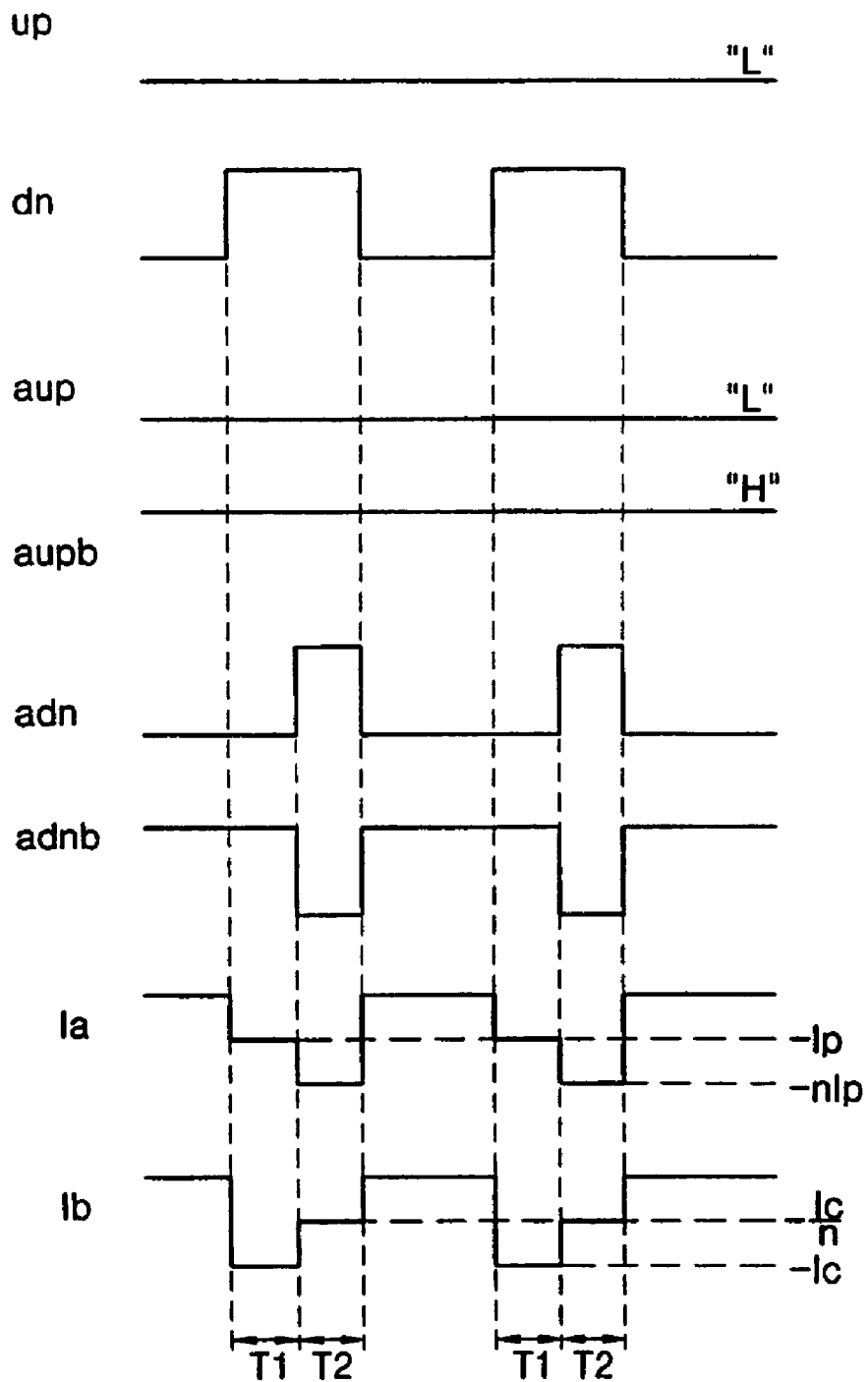

PHASE LOCKED LOOP WITH ADAPTIVE LOOP BANDWIDTH

RELATED APPLCATIONS

This application claims priority under 35 U.S.C. 119 to Korean Patent Application KR2004-24570, filed Apr. 9, 2004, the contents of which are incorporated herein by reference, in their entirety.

BACKGROUND OF THE INVENTION

Communication between integrated circuit systems commonly requires that the phase and/or frequency of an input signal be matched, or "locked" to a local signal, such as a clock signal. A typical system for accomplishing this is the phase-locked loop (PLL).

FIG. 1 is a block diagram of a conventional phase locked loop configuration. The conventional PLL 11 includes a phase frequency detector (PFD) 10, a first charge pump (CP) 12, an operational amplifier 16, and a voltage controlled oscillator (VCO) 18. An optional second charge pump (CP) 14 may also be included.

The phase frequency detector 10 measures a phase difference between a received reference clock signal RCLK and a feedback clock signal VCLK. In response to the difference in phase between the clock signals, the phase frequency detector 10 generates an up control signal up and a down control signal dn, which are provided to the first charge pump 12. The first charge pump 12, in turn, charges and discharges a first capacitor $C_p$ of a loop filter in response to the up control signal up and down control signal dn, in turn generating a loop filter control voltage $V_p$. The loop filter control voltage $V_p$ is provided to the VCO to determine the output frequency of the VCO 18.

In combination, the first charge pump 12 and first capacitor provide a pole for the feedback loop, however, it is preferred that a loop-stabilizing zero also be included in order to maintain stability in the phase locked loop. A resistor can be placed in series with the first capacitor $C_p$ for this purpose. This embodiment, however, is prone to process and temperature variation, which, in turn, can lead to variable operation characteristics. In addition, the value of the series resistor is difficult to adjust and reproduce accurately.

In an alternative embodiment shown in FIG. 1, a zero for the feedback loop is provided by the combination of the second charge pump 14, the operational amplifier 16, and a second capacitor $C_c$. The second charge pump 14 receives the up control signal up and down control signal dn, and, in response, charges and discharges the second capacitor $C_c$. The operational amplifier 16 receives at a positive input terminal the loop filter control voltage $V_p$, and provides, at an output terminal, a VCO control voltage $V_c$, that is applied to the second capacitor $C_c$. A closed-loop negative feedback signal is provided between the output terminal and negative input terminal of the operational amplifier 16. The VCO control voltage $V_c$ is applied to the VCO to determine the output frequency of the VCO 18.

While the configuration of FIG. 1 provides for a relatively stable phase locked loop operation, the current $I_p$ that is provided by the first charge pump 12 is fixed, and therefore, the locking time period for the loop is less than optimal. Also, the second charge pump 14 used in combination with the operational amplifier 16 to improve loop stability requires a large area of the chip die, leading to manufacturing inefficiencies.

SUMMARY OF THE INVENTION

The present invention is directed to a semiconductor device that includes an adaptive phase locked loop with improved loop stability and a faster locking rate. In one embodiment, this is accomplished in a manner that does not require an additional second charge pump for loop stability, and therefore the resulting phase locked loop of the present invention consumes less chip die area. In another embodiment, multiple charge pumps are used and the resulting response time for locking is improved over that which can be achieved by conventional embodiments.

In a first aspect, the present invention is directed to a phase locked loop. A first charge pump receives first and second control signals generated in response to a comparison of phases of a reference clock signal and a feedback signal and, in response, generates a first charge pump signal. A loop filter includes an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs. A voltage controlled oscillator receives the control voltage and, in response, generates the feedback clock signal.

In one embodiment, a phase detector receives the reference clock signal and the feedback clock signal, compares their respective phases, and generates the first and second control signals in response to the comparison. In another embodiment, a phase-frequency detector receives the reference clock signal and the feedback clock signal, compares their respective phases and frequencies, and generates the first and second control signals in response to the comparison.

In another embodiment, the first control signal comprises an up control signal and wherein the second control signal comprises a down control signal. The first control signal is activated in response to the rising edge of the reference clock signal and the second control signal is activated in response to the rising edge of the feedback clock signal.

In another embodiment, the operational amplifier comprises: a first transistor, coupled between a first voltage supply and a first node, and a gate of which is coupled to a drain of which at a first node; a second transistor, coupled between the first voltage supply and a second node, and a gate of which is coupled to the first node; a third transistor and a fourth transistor coupled in series between the first node and a third node, a gate of one of the third and fourth transistors being coupled to the first control signal and a gate of the other of the third and fourth transistors being coupled to the first charge pump signal; a fifth transistor, coupled between the first node and the third node, and a gate of which is coupled to the first charge pump signal; a sixth transistor and a seventh transistor coupled in series between the second node and the third node, a gate of one of the sixth and seventh transistors being coupled to the second control signal and a gate of the other of the sixth and seventh transistors being coupled to the control voltage signal; an eighth transistor, coupled between the second node and the third node, a gate of which is coupled to the control voltage signal; and a ninth transistor, coupled between the third node and a ground reference voltage, and a gate of which receives a voltage bias signal. The first and second transistors comprise PMOS transistors, and the third, fourth, fifth, sixth, seventh, eighth, and ninth transistors comprise NMOS transistors.

In another embodiment, the voltage bias signal is derived from the first charge pump signal In another embodiment, the first charge pump comprises a first current source and a first charge pump transistor in series between a first voltage supply and a first node, and a second charge pump transistor and a second current source in series between the first node and a ground reference voltage, the first charge pump transistor being activated in response to the first control signal and the second charge pump transistor being activated in response to the second control signal, the first charge pump providing the charge pump signal at the first node. The first charge pump transistor comprises a PMOS transistor and the first control signal comprises an inverted up control signal; the second charge pump transistor comprises an NMOS transistor and the second control signal comprises a down control signal.

In another embodiment, the operational amplifier of the loop filter comprises a first operational amplifier and the control voltage generated by the first operational amplifier comprises a first control voltage, and a second operational amplifier receives the first control voltage at a first input and that generates a second control voltage that is provided to the voltage controlled oscillator, a second input of the second operational amplifier receiving the second control voltage via a feedback path.

In another embodiment, the phase locked loop further comprises: a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and a second charge pump that receives the first and second auxiliary control signals and, in response, generates an auxiliary charge pump signal, the auxiliary charge pump signal being applied to the first input of the operational amplifier in combination with the first charge pump signal. A control signal generator receives the first and second auxiliary control signals and, if either of the first and second auxiliary control signals is active, generates a third control signal, and the operational amplifier includes a fifth input that receives the third control signal, and generates the control voltage further in response to the third control signal. In another embodiment, the control signal generator comprises an OR gate, a first input of which receives the first auxiliary control signal, a second input of which receives the second auxiliary control signal, and an output of which provides the third control signal.

In another embodiment, the operational amplifier comprises: a first transistor, coupled between a first voltage supply and a first node, and a gate of which is coupled to a drain of which at a first node; a second transistor, coupled between the first voltage supply and a second node, and a gate of which is coupled to the first node; a third transistor and a fourth transistor coupled in series between the first node and a third node, a gate of one of the third and fourth transistors being coupled to the first control signal and a gate of the other of the third and fourth transistors being coupled to the first charge pump signal; a fifth transistor and a sixth transistor coupled in series between the first node and the third node, a gate of one of the fifth and sixth transistors being coupled to the third control signal and a gate of the other of the fifth and sixth transistors being coupled to the first charge pump signal; a seventh transistor, coupled between the first node and the third node, a gate of which is coupled to the charge pump signal; a eighth transistor and a ninth transistor coupled in series between the second node and the third node, a gate of one of the eighth and ninth transistors being coupled to the second control signal and a gate of the other of the eighth and ninth NMOS transistors being coupled to the control voltage signal; a tenth transistor and an eleventh transistor coupled in series between the second node and the third node, a gate of one of the tenth and eleventh transistors being coupled to the third control signal and a gate of the other of the tenth and eleventh transistors being coupled to the control voltage signal; a twelfth transistor, coupled between the second node and the third node, and a gate of which is coupled to the control voltage signal; and a thirteenth transistor, coupled between the third node and a ground reference voltage, and a gate of which receives a voltage bias signal. The first and second transistors comprise PMOS transistors, and wherein third, fourth, fifth, sixth, seventh, eighth, ninth, tenth, eleventh, twelfth, and thirteenth transistors comprise NMOS transistors.

In another embodiment, the pulse width filter comprises first, second and third transistors in series between a first voltage supply and a ground reference voltage, gates of the first and second transistors receiving one of the first and second control signals; a delay circuit receiving the one of the first and second control signals to generate a delayed control signal, the control signal being applied to a gate of the third transistor; a corresponding one of the first and second auxiliary control signals being provided at a node between the first and second transistors.

In another embodiment, the second charge pump comprises a third current source and a third charge pump transistor in series between a first voltage supply and a second node, and a fourth charge pump transistor and a fourth current source in series between the second node and a ground reference voltage, the third charge pump transistor being activated in response to the first auxiliary control signal and the second charge pump transistor being activated in response to the second auxiliary control signal, the second charge pump providing the auxiliary charge pump signal at the second node. The third charge pump transistor comprises a PMOS transistor and the first auxiliary control signal comprises an inverted auxiliary up control signal and the fourth charge pump transistor comprises an NMOS transistor and the second control signal comprises the auxiliary down control signal.

In another embodiment, the loop filter further includes a first capacitor between the first input of the operational amplifier and a ground reference voltage and a second capacitor between the output of the operational amplifier and the ground reference voltage.

In another aspect, the present invention is directed to a phase locked loop comprising: a phase detector that receives a reference clock signal and a feedback clock signal, compares a difference in phase between the reference clock signal and the feedback clock signal, and generates first and second control signals in response to the comparison; a first charge pump that receives the first and second control signals and that, in response, generates a first charge pump signal; a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period; and a second charge pump that receives the first and second auxiliary control signals and, in response, generates an auxiliary charge pump signal; a loop filter that receives the first charge pump signal and, in response, generates a control voltage, the loop filter comprising an operational amplifier having a first input that receives in combination the first charge pump signal and the auxiliary charge pump signal, second and third inputs that receive the first and second control signals respectively, and a fourth input that receives a control voltage, and an output that generates the control voltage in response to the signals provided at the first, second, third and fourth inputs; and a voltage controlled oscillator that receives the control voltage and, in response, generates the reference clock signal.

In one embodiment, a control signal generator receives the first and second auxiliary control signals and if either of the first and second auxiliary control signals is active, generates a third control signal, and the operational amplifier includes a fifth input that receives the third control signal, and generates the control voltage further in response to the third control signal. The control signal generator comprises an OR gate, a first input of which receives the first auxiliary control signal, a second input of which receives the second auxiliary control signal, and an output of which generates the third control signal In one embodiment, when the phase locked loop operates in a first mode of operation, the reference clock signal and the feedback clock signal are substantially locked and when the phase locked loop operates in a second mode of operation, the reference clock signal and the feedback clock signal are out of phase by at least a predetermined amount; and wherein, when the phase locked loop operates in the first mode, the first charge pump is active and the second charge pump is inactive; and when the phase locked loop operates in the second mode of operation, the first charge pump is active and the second charge pump is active.

In another aspect, the present invention is directed to a phase locked loop comprising: a phase detector that receives a reference clock signal and a feedback clock signal, compares a difference in phase of the reference clock signal and the feedback clock signal, and generates first and second control signals in response to the comparison; a first charge pump that receives the first and second control signals and that, in response, generates a first charge pump signal; a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period; a second charge pump that receives the first and second auxiliary control signals and, in response, generates a second charge pump signal; a third charge pump that receives the first and second control signals and, in response, generates a third charge pump signal; a fourth charge pump that receives the first and second control signals and the first and second auxiliary control signals and, in response, generates a fourth charge pump signal; a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and a voltage controlled oscillator that receives the control voltage and, in response, generates the reference clock signal.

In one embodiment, when the phase locked loop operates in a first mode of operation, the reference clock signal and the feedback clock signal are substantially locked and when the phase locked loop operates in a second mode of operation, the reference clock signal and the feedback clock signal are out of phase by at least a predetermined amount; and wherein, when the phase locked loop operates in the first mode, the first charge pump, third charge pump and fourth charge pump are active and the second charge pump is inactive; and when the phase locked loop operates in the second mode of operation, the first charge pump, second charge pump and third charge pump are active and the fourth charge pump is inactive.

In one embodiment, the first charge pump comprises a first current source and a first charge pump transistor in series between a first voltage supply and a first node, and a second charge pump transistor and a second current source in series between the first node and a ground reference voltage, the first charge pump transistor being activated in response to the first control signal and the second charge pump transistor being activated in response to the second control signal, the first charge pump providing the first charge pump signal at the first node.

In one embodiment, the second charge pump comprises a third current source and a third charge pump transistor in series between a first voltage supply and a second node, and a fourth charge pump transistor and a fourth current source in series between the second node and a ground reference voltage, the third charge pump transistor being activated in response to the first auxiliary control signal and the second charge pump transistor being activated in response to the second auxiliary control signal, the second charge pump providing the second charge pump signal at the second node.

In one embodiment, the third charge pump comprises a fifth current source and a fifth charge pump transistor in series between a first voltage supply and a third node, and a sixth charge pump transistor and a sixth current source in series between the third node and a ground reference voltage, the fifth charge pump transistor being activated in response to the first control signal and the sixth charge pump transistor being activated in response to the second control signal, the third charge pump providing the third charge pump signal at the third node.

In one embodiment, the fourth charge pump comprises a seventh current source and seventh and eighth charge pump transistors in series between a first voltage supply and a fourth node, and ninth and tenth charge pump transistors and an eighth current source in series between the third node and a ground reference voltage, the seventh charge pump transistor being activated in response to the first control signal, the eighth charge pump transistor being activated in response to the first auxiliary control signal, the ninth charge pump transistor being activated in response to the second auxiliary control signal and the tenth charge pump transistor being activated in response to the second control signal, the fourth charge pump providing the fourth charge pump signal at the fourth node.

In another aspect, the present invention is directed to a memory device comprising: a plurality of addressable memory cells, each cell comprising a data storage element; a decoder that receives an address from an external source, and that generates a row signal and a column signal for accessing at least one of the addressable memory cells; and a phase locked loop. The phase locked loop comprises: a first charge pump that receives first and second control signals generated in response to a comparison of phases of a reference clock signal and a feedback signal and that, in response, generates a first charge pump signal; a loop filter comprising an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs; and a voltage controlled oscillator that receives the control voltage signal and, in response, generates the feedback clock signal.

In one embodiment, the operational amplifier of the loop filter comprises a first operational amplifier and wherein the control voltage generated by the first operational amplifier comprises a first control voltage, and further comprising a second operational amplifier that receives the first control voltage at a first input and that generates a second control voltage that is provided to the voltage controlled oscillator, a second input of the second operational amplifier receiving the second control voltage via a feedback path.

In another embodiment, the memory device further comprises: a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and a second charge pump that receives the first and second auxiliary control signals and, in response, generates an auxiliary charge pump signal, the auxiliary charge pump signal being applied to the first input of the operational amplifier in combination with the first charge pump signal.

In another embodiment, the memory device further comprises a control signal generator that receives the first and second auxiliary control signals and that, if either of the first and second auxiliary control signals is active, generates a third control signal, and wherein the operational amplifier includes a fifth input that receives the third control signal, and generates the control voltage further in response to the third control signal.

In another aspect, the present invention is directed to a memory device comprising: a plurality of addressable memory cells, each cell comprising a data storage element; a decoder that receives an address from an external source, and that generates a row signal and a column signal for accessing at least one of the addressable memory cells; and a phase locked loop. The phase locked loop comprises a phase detector that receives a reference clock signal and a feedback clock signal, compares a difference in phase of the reference clock signal and the feedback clock signal, and generates first and second control signals in response to the comparison; a first charge pump that receives the first and second control signals and that, in response, generates a first charge pump signal; a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period; a second charge pump that receives the first and second auxiliary control signals and, in response, generates a second charge pump signal; a third charge pump that receives the first and second control signals and, in response, generates a third charge pump signal; a fourth charge pump that receives the first and second control signals and the first and second auxiliary control signals and, in response, generates a fourth charge pump signal; a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and a voltage controlled oscillator that receives the control voltage signal and, in response, generates the reference clock signal.

In another aspect, the present invention is directed to a memory system comprising: a memory controller that generates command and address signals; and a memory module comprising a plurality of memory devices, the memory module receiving the command and address signals and in response storing and retrieving data to and from the memory device, wherein each memory device comprises: a plurality of addressable memory cells, each cell comprising a data storage element; a decoder that receives an address from an external source, and that generates a row signal and a column signal for accessing at least one of the addressable memory cells; and a phase locked loop. The phase locked loop comprises: a first charge pump that receives first and second control signals generated in response to a comparison of phases of a reference clock signal and a feedback signal and that, in response, generates a first charge pump signal; a loop filter comprising an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs; and a voltage controlled oscillator that receives the control voltage signal and, in response, generates the feedback clock signal.

In one embodiment, the operational amplifier of the loop filter comprises a first operational amplifier and wherein the control voltage generated by the first operational amplifier comprises a first control voltage, and further comprising a second operational amplifier that receives the first control voltage at a first input and that generates a second control voltage that is provided to the voltage controlled oscillator, a second input of the second operational amplifier receiving the second control voltage via a feedback path.

In another embodiment, the memory system further comprises: a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and a second charge pump that receives the first and second auxiliary control signals and, in response, generates an auxiliary charge pump signal, the auxiliary charge pump signal being applied to the first input of the operational amplifier in combination with the first charge pump signal.

In another embodiment, the memory system further comprises a control signal generator that receives the first and second auxiliary control signals and that, if either of the first and second auxiliary control signals is active, generates a third control signal, and wherein the operational amplifier includes a fifth input that receives the third control signal, and generates the control voltage further in response to the third control signal.

In another aspect, the present invention is directed to a memory system comprising: a memory controller that generates command and address signals; and a memory module comprising a plurality of memory devices, the memory module receiving the command and address signals and in response storing and retrieving data to and from the memory device, wherein each memory device comprises: a plurality of addressable memory cells, each cell comprising a data storage element; a decoder that receives an address from an external source, and that generates a row signal and a column signal for accessing at least one of the addressable memory cells; and a phase locked loop. The phase locked loop comprises: a phase detector that receives a reference clock signal and a feedback clock signal, compares a difference in phase of the reference clock signal and the feedback clock signal, and generates first and second control signals in response to the comparison; a first charge pump that receives the first and second control signals and that, in response, generates a first charge pump signal; a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period; a second charge pump that receives the first and second auxiliary control signals and, in response, generates a second charge pump signal; a third charge pump that receives the first and second control signals and, in response, generates a third charge pump signal; a fourth charge pump that receives the first and second control signals and the first and second auxiliary control signals and, in response, generates a fourth charge pump signal; a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and a voltage controlled oscillator that receives the control voltage signal and, in response, generates the reference clock signal.

In another aspect, the present invention is directed to a method comprising: receiving at a first charge pump first and second control signals generated in response to a comparison of phases of a reference clock signal and a feedback signal and, in response, generating a first charge pump signal; receiving at an operational amplifier the first charge pump signal at a first input, receiving the first and second control signals respectively at second and third inputs of the operational amplifier, and receiving a control voltage at a fourth input of the operational amplifier, and generating, at an output of the operational amplifier, the control voltage in response to the signals provided at the first, second, third and fourth inputs; and receiving the control voltage signal at a voltage controlled oscillator, and, in response, generating the feedback clock signal.

In one embodiment of the method, the operational amplifier comprises a first operational amplifier and wherein the control voltage generated by the first operational amplifier comprises a first control voltage, and further comprising receiving at a second operational amplifier the first control voltage at a first input and generating a second control voltage that is provided to the voltage controlled oscillator, a second input of the second operational amplifier receiving the second control voltage via a feedback path.

In another embodiment, the method further comprises: receiving at a pulse width filter the first control signal, and in response, generating a first auxiliary control signal when the first control signal is active for greater than a first predetermined time period; and receiving at the pulse width filter the second control signal, and in response, generating a second auxiliary control signal when the second control signal is active for greater than a second predetermined time period; and receiving at a second charge pump the first and second auxiliary control signals and, in response, generating an auxiliary charge pump signal, the auxiliary charge pump signal being applied to the first input of the operational amplifier in combination with the first charge pump signal.

In another embodiment, the method further comprises: receiving at a control signal generator the first and second auxiliary control signals and, if either of the first and second auxiliary control signals is active, generating a third control signal, and receiving at a fifth input of the operational amplifier the third control signal, and generating at the output of the operational amplifier the control voltage further in response to the third control signal.

In another aspect, the present invention is directed to a method comprising: receiving at a phase detector, a reference clock signal and a feedback clock signal, comparing a difference in phase of the reference clock signal and the feedback clock signal, and generating first and second control signals in response to the comparison; receiving at a first charge pump the first and second control signals and, in response, generating a first charge pump signal; receiving at a pulse width filter the first control signal, and in response, generating a first auxiliary control signal when the first control signal is active for greater than a first predetermined time period, and receiving the second control signal, and in response, generating a second auxiliary control signal when the second control signal is active for greater than a second predetermined time period; receiving at a second charge pump the first and second auxiliary control signals and, in response, generating a second charge pump signal; receiving at a third charge pump the first and second control signals and, in response, generating a third charge pump signal; receiving at a fourth charge pump the first and second control signals and the first and second auxiliary control signals and, in response, generating a fourth charge pump signal; receiving at a loop filter comprising an operational amplifier in combination at a first input the first charge pump signal and the second charge pump signal, receiving in combination at a second input the third charge pump signal, the fourth charge pump signal and a control voltage signal, and generating at an output the control voltage signal in response to the signals provided at the first and second inputs; and receiving at a voltage controlled oscillator the control voltage signal and, in response, generating the reference clock signal.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 13A_1 and 13A_2 are timing diagrams of signals of the fourth phase locked loop embodiment of FIG. 11, illustrating the first mode of operation of the fourth embodiment, in accordance with the present invention.

FIGS. 13B_1 and 13B_2 are additional timing diagrams of signals of the fourth phase locked loop embodiment of FIG. 11, illustrating the first and second modes of operation of the fourth embodiment, in accordance with the present invention.

DETAILED DESCRIPTION OF PREFERRED EMBODIMENTS

Figure 1:
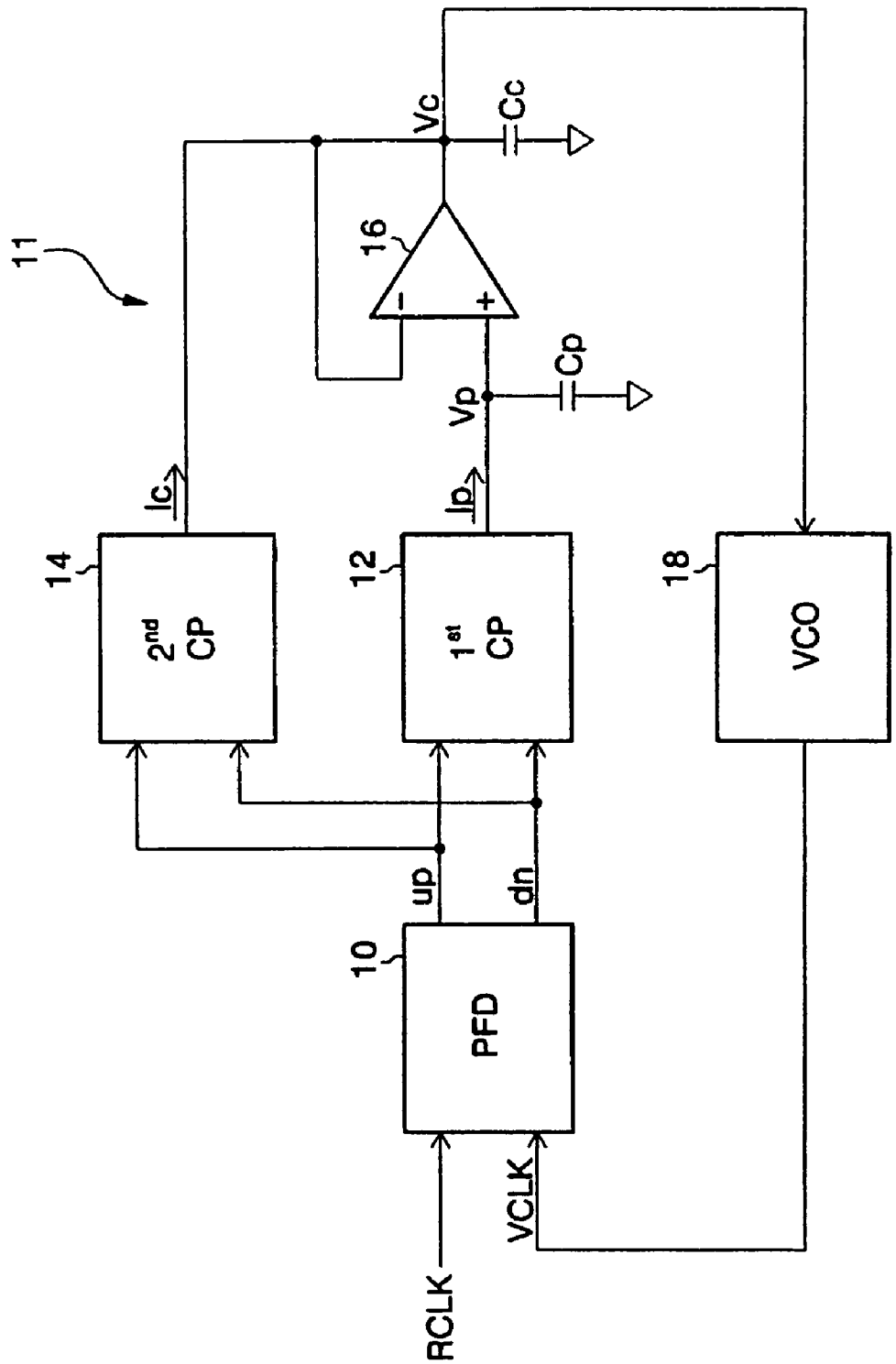
FIG. 1 is a block diagram of a conventional phase locked loop configuration.
Figure 2:
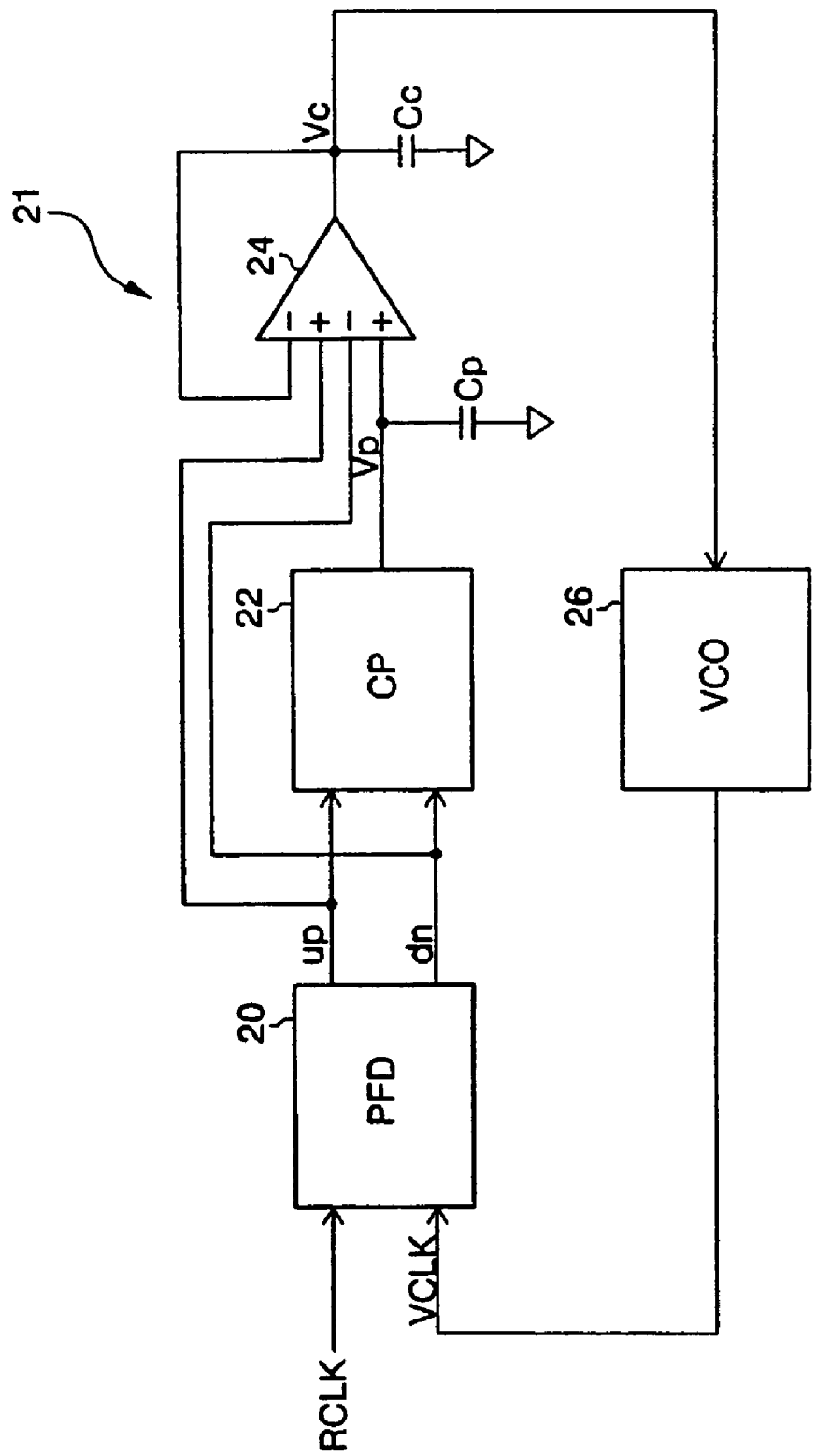
FIG. 2 is a block diagram of an embodiment of a phase locked loop configuration in accordance with the present invention.

FIG. 2 is a block diagram of an embodiment of a phase locked loop (PLL) configuration in accordance with the present invention. The PLL 21 includes a phase frequency detector (PFD) 20, a first charge pump (CP) 22, an operational amplifier 24, and a voltage controlled oscillator (VCO) 26.

The phase frequency detector 20 measures a phase difference between a received reference clock signal RCLK and a feedback clock signal VCLK. In response to the difference in phase between the clock signals, the phase frequency detector 20 generates an up control signal up and a down control signal dn, which are provided to the first charge pump 22. The first charge pump 22, in turn, charges and discharges a first capacitor $C_p$ of a loop filter in response to the up control signal up and down control signal dn, in turn generating a loop filter control voltage or first charge pump voltage $V_p$. The first charge pump voltage $V_p$ is provided as an input to the multiple-input operational amplifier 24 (in this case, a four-input operational amplifier) at a positive input terminal. In addition, the up control signal up is provided to a positive input terminal of the multiple-input operational amplifier 24 and the down control signal dn is provided to a negative input terminal of the multiple-input operational amplifier 24. Also, a negative feedback loop of the operational amplifier is provided between an output of the operational amplifier 24 and a negative input terminal of the operational amplifier 24.

The output of the operational amplifier 24 is applied to a second capacitor $C_c$, and the resulting voltage across the second capacitor $C_c$ is applied to the VCO 26 as a VCO control voltage $V_c$ to determine the output frequency of the VCO 26. The output signal of the VCO 26 is applied to the phase frequency detector 20 as the feedback clock signal VCLK.

In this embodiment of the present invention, in combination, the first charge pump 22 and first capacitor $C_p$ provide a pole for the feedback loop. A loop-stabilizing zero is provided by the operational amplifier 24 receiving the down control signal dn and up control signal up. The control voltage $V_c$ for the VCO 26 is provided solely by the output of the multiple-input operational amplifier 24. In this manner, a loop-stabilizing zero is provided without the inclusion of a resistor, which has the limitations described above in connection with the conventional embodiment. In addition, a second charge pump is not necessary in this embodiment for providing the loop-stabilizing zero, and therefore circuit size can be reduced.

Figure 3:
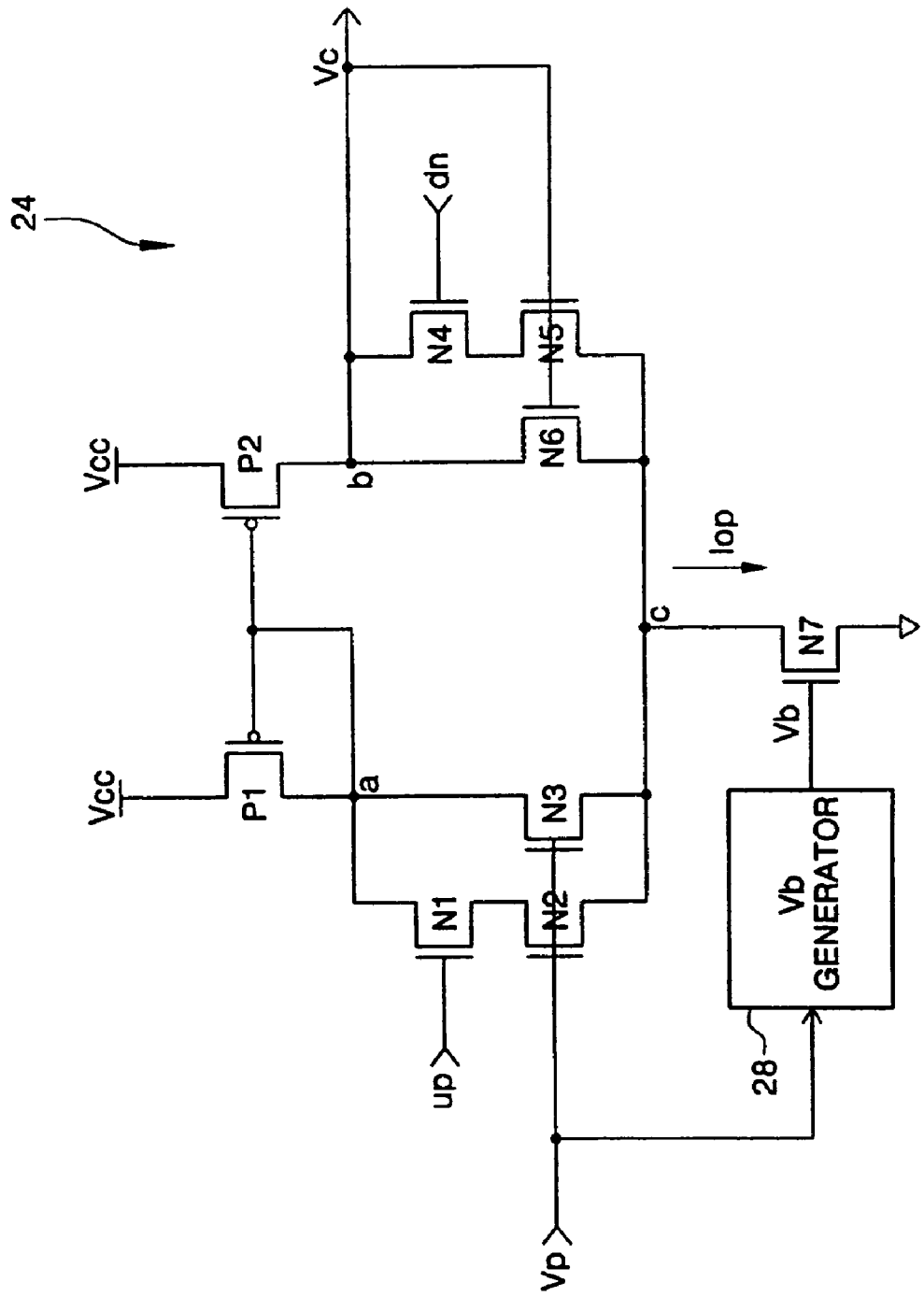
FIG. 3 is a detailed schematic diagram of the operational amplifier of the phase locked loop of FIG. 2, in accordance with the present invention.

FIG. 3 is a detailed schematic diagram of the operational amplifier 24 of the phase locked loop of FIG. 2, in accordance with the present invention. The operational amplifier 24 includes a first PMOS transistor P1, a source of which is connected to a first voltage source Vcc, and a gate and drain of which are connected to a first node a. A second PMOS transistor P2, has a source that is connected to the first power source Vcc, a gate that is connected to the first node a, and a drain that is connected to a second node b. A first NMOS transistor N1 and a second NMOS transistor N2 are coupled in series between the first node a and a third node c, a gate of one of the first and second NMOS transistors, for example transistor N1, being coupled to the up control signal up and a gate of the other of the first and second NMOS transistors, for example transistor N2, being coupled to the first charge pump signal $V_p$. The order of the series of the first and second NMOS transistors N1, N2 can be reversed. A third NMOS transistor N3 includes a drain that is coupled to the first node a, a gate that is coupled to the first charge pump signal $V_p$, and a source that is coupled to the third node c. A fourth NMOS transistor N4 and a fifth NMOS transistor N5 are coupled in series between the second node b and the third node c, a gate of one of the fourth and fifth NMOS transistors, for example transistor N4, being coupled to the down control signal dn and a gate of the other of the fourth and fifth NMOS transistors, for example transistor N5, being coupled to the second node b. The order of the series of the fourth and fifth NMOS transistors N4, N5 can be reversed. A sixth NMOS transistor N6 includes a drain that is coupled to the second node b, a gate that is coupled to the second node b, and a source that is coupled to the third node c. A seventh NMOS transistor N7, has a drain that is coupled to the third node c, a source that is coupled to a ground reference voltage, and a gate of which receives a voltage bias signal $V_b$. The voltage bias signal $V_b$ is generated by a voltage bias generator 28, which receives the first charge pump signal $V_p$, and, in response to the voltage level of the first charge pump signal $V_p$, generates the voltage bias signal $V_b$.

In this manner, the operational amplifier 24 includes a single output, namely the second node b, which provides the control voltage $V_c$ for the VCO. The operational amplifier also includes four inputs, namely, the up control signal up and the first charge pump signal $V_p$, which are received at positive input terminals of the operational amplifier, and the down control signal dn and the control voltage $V_c$ for the VCO (the output signal of the operational amplifier 24), which are received at negative input terminals of the operational amplifier 24.

In other embodiments, such as those discussed below, the operational amplifier 24 can include additional, or fewer, positive and negative input terminals of a number that depends on the application of the phase locked loop.

When the up control signal up is enabled, the output voltage of the second node b becomes larger than that of the first node a. This is because, while the up control signal up is enabled, the channel width between the first node a and the third node c becomes larger than the channel width between the second node b and the third node c, because the first NMOS transistor N1 is activated by the active up control signal up, and the fourth NMOS transistor N4 is deactivated because the down control signal dn is inactive during this time. Under these conditions, the offset voltage $(V_p-V_c)$ has a negative voltage value.

For the opposite case, when the down control signal dn is enabled (accordingly, the up control signal up becomes disabled), the output voltage of the second node b becomes smaller than that of the first node a. This is because, while the down control signal down is enabled, the channel width between the first node a and the third node c becomes smaller than the channel width between the second node b and the third node c, because the first NMOS transistor N1 is deactivated by the inactive up control signal up, and the fourth NMOS transistor N4 is activated because the down control signal dn is active during this time. Under these conditions, the offset voltage $(V_p-V_c)$ has a positive voltage value.

The offset voltage $(V_p-V_c)$, Vos, can be represented as Vos=(Iop/Gm)*(Δw/w), where Iop is the current flowing through the seventh NMOS transistor N7, Gm is the conductance of the operational amplifier, W is the channel width of the N3 and N6 transistors of FIG. 3, and Δw is the channel width of the N2 and N5 transistors of FIG. 3

An advantage of the present first embodiment of the present invention lies in that the voltage $V_c$ provided at the output of the operational amplifier 24 is provided solely by the operational amplifier 24 and thus, no additional charge pump is needed for this purpose.

Figure 4A:
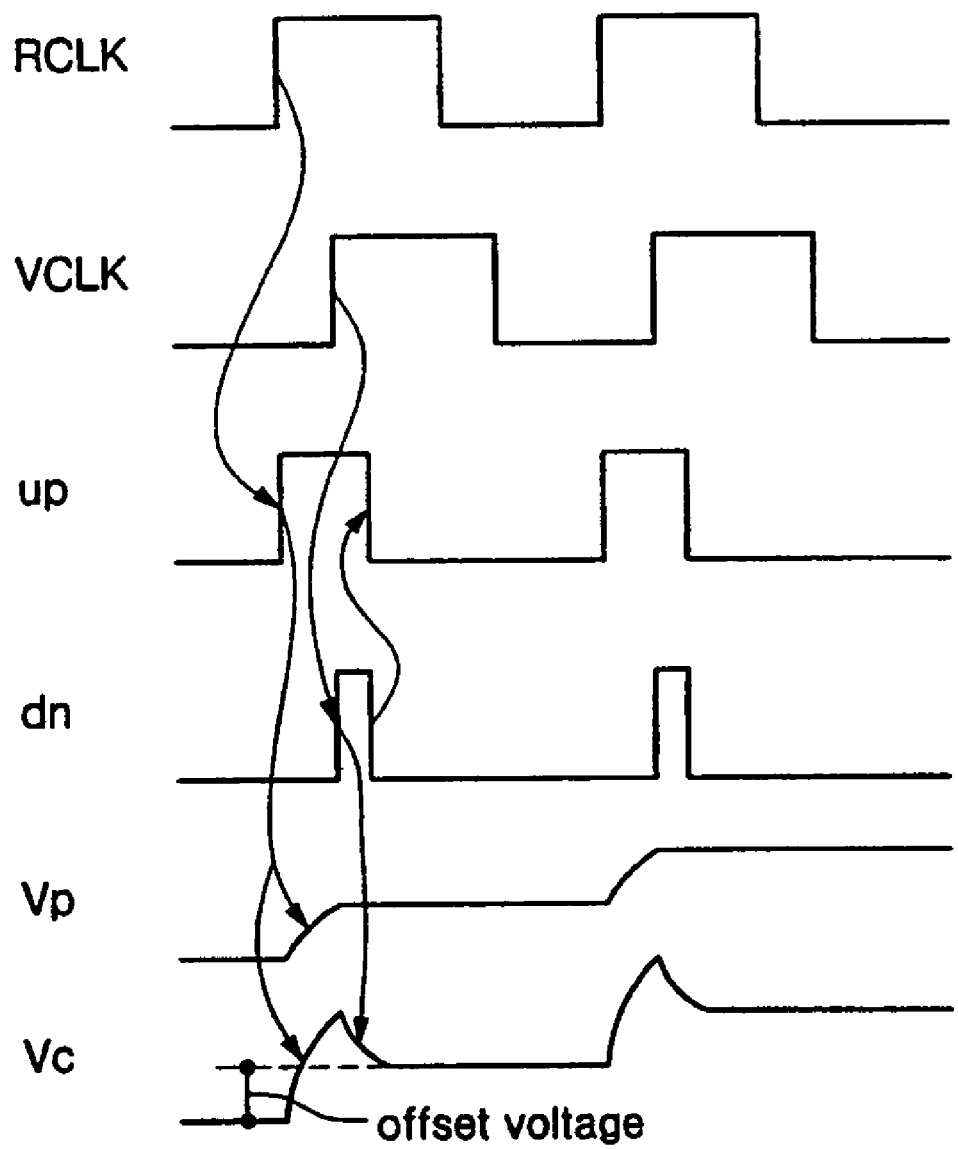
FIG. 4A is a first timing diagram of signals of the phase locked loop of FIG. 2, in the case where the reference clock signal leads the feedback output clock signal, in accordance with the present invention.

FIG. 4A is a first timing diagram of signals of the phase locked loop of FIG. 2, in the case where the reference clock signal RCLK leads the feedback clock signal VCLK, in accordance with the present invention. At the rising edge of the RCLK signal, the up control signal up is activated by the phase frequency detector 20. With activation of the up control signal up, the first charge pump 22 causes the first charge pump signal $V_p$ to charge the first capacitor $C_p$, and thus $V_p$ increases at a first rate and the VCO control voltage $V_c$ increases at a second rate that is faster than the first rate due to the negative offset voltage of the operational amplifier 24. Following this, at the rising edge of the VCLK signal, the down control signal down is activated by the phase frequency detector 20. With activation of the down control signal down, the first charge pump 22 causes the first charge pump signal $V_p$ to maintain the charge of the capacitor $C_p$, and thus $V_p$ remains the same and the VCO control voltage $V_c$ begins to decrease until it is approximately equal to the negative offset voltage (Vp−Vc) of the operational amplifier 24. The overlap time of the up control signal up and the down control signal dn signal is determined by the internal delay of the phase frequency detector. The overlap time is fixed and does not vary according to the input condition.

This process repeats until the feedback clock signal VCLK is aligned with, and therefore locked with, the reference clock signal RCLK.

Figure 4B:
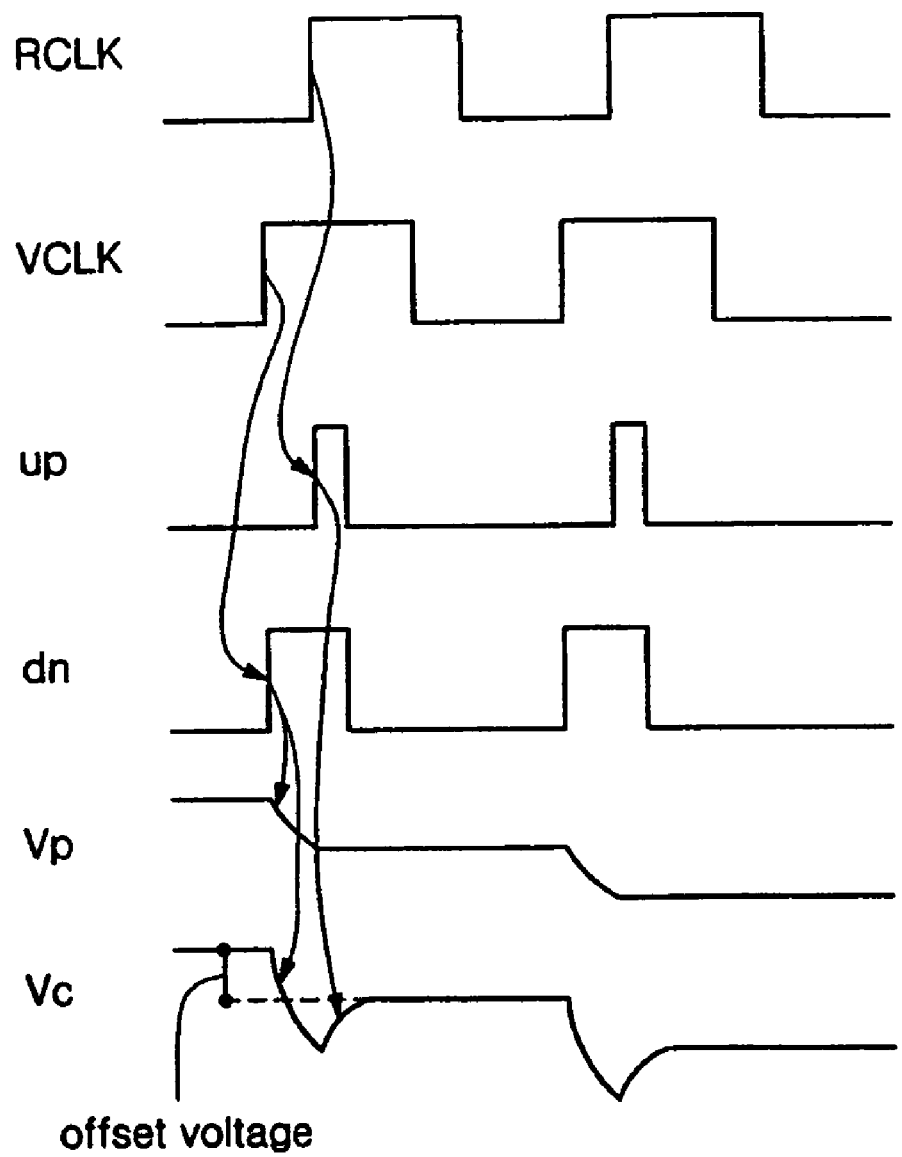
FIG. 4B is a second timing diagram of signals of the phase locked loop of FIG. 2, in the case where the reference clock signal lags the feedback clock signal, in accordance with the present invention.

FIG. 4B is a second timing diagram of signals of the phase locked loop of FIG. 2, in the case where the reference clock signal RCLK lags the feedback clock signal VCLK, in accordance with the present invention. At the rising edge of the VCLK signal, the down control signal down is activated by the phase frequency detector 20. With activation of the down control signal down, the first charge pump 22 causes the first charge pump signal $V_p$ to discharge the first capacitor $C_p$, and thus $V_p$ decreases at a first rate and the VCO control voltage $V_c$ decreases at a second rate that is faster than the first rate due to the positive offset voltage of the operational amplifier 24. Following this, at the rising edge of the RCLK signal, the up control signal up is activated by the phase frequency detector 20. With activation of the up control signal up, the first charge pump 22 causes the first charge pump signal $V_p$ to maintain the charge of the capacitor $C_p$, and thus $V_p$ remains the same, and the VCO control voltage $V_c$ begins to increase until it is approximately equal to the positive offset voltage (Vp−Vc) of the operational amplifier 24. This process repeats until the feedback clock signal VCLK is aligned with, and therefore locked with, the reference clock signal RCLK.

In this manner, the direct application of the up control signal up and the down control signal dn to the operational amplifier affects the difference in effective channel widths between the first node a and third node c, and between the second node b and third node c. In the case where the up control signal up is activated, the effective channel width of the N3 transistor is increased by activation of the N1 transistor. Thus, a negative offset voltage is applied to the operational amplifier. In the case where the down control signal dn is activated, the effective channel width of the N6 transistor is increased by activation of the N4 transistor. Thus, a positive offset voltage is applied to the operational amplifier.

Figure 5:
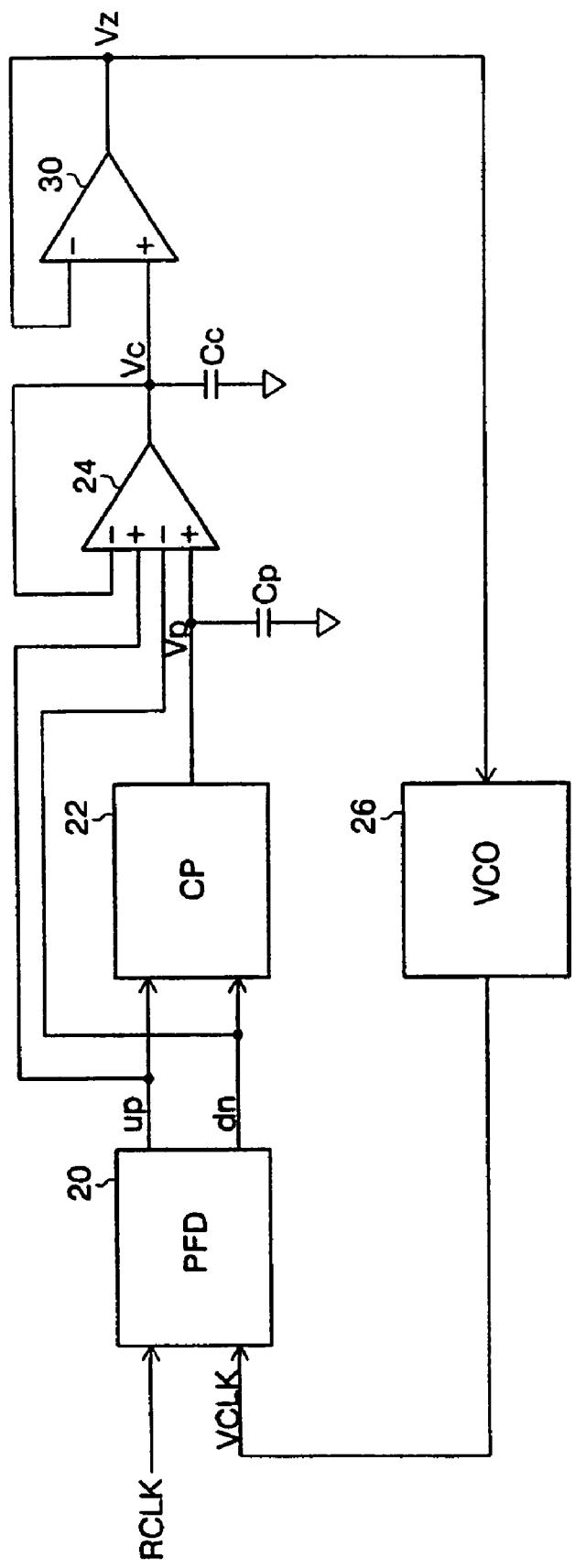
FIG. 5 is a block diagram of a second embodiment of a phase locked loop configuration in accordance with the present invention.

FIG. 5 is a block diagram of a second embodiment of a phase locked loop configuration in accordance with the present invention. In this configuration, the VCO control voltage $V_c$ is applied to a positive input terminal of a second operational amplifier 30. The output terminal of the second operational amplifier 30 provides a third voltage Vz that is fed back to a negative input terminal of the second operational amplifier 30 to provide a negative feedback loop. The third voltage Vz is applied to an input of the VCO 26 as a control voltage for the VCO. The third voltage Vz provided in this embodiment, has reduced jitter, as compared to the control voltage $V_c$, which leads to more stable operation in the phase locked loop. Also, the second operational amplifier 30 operates as a current buffer for the VCO control voltage $V_c$ signal, to ensure that sufficient current is provided to the VCO 26.

Figure 6:
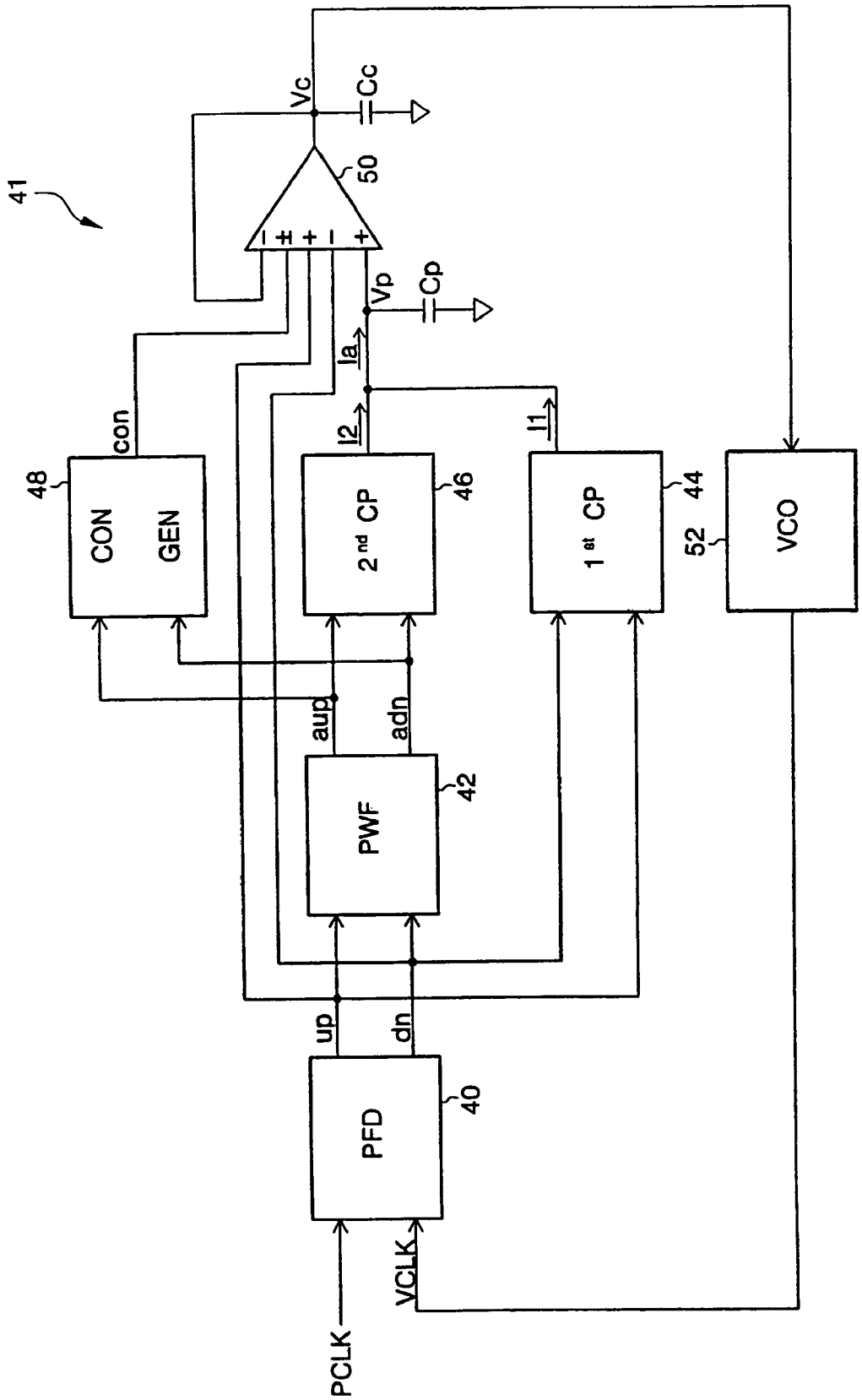
FIG. 6 is a block diagram of a third embodiment of a phase locked loop configuration in accordance with the present invention.

FIG. 6 is a block diagram of a third embodiment of a phase locked loop configuration in accordance with the present invention. In this embodiment, the phase locked loop circuit 41 includes a phase frequency detector (PFD) 40, a first charge pump (CP) 44, an operational amplifier 50, and a voltage controlled oscillator (VCO) 52. As in the first and second embodiments of FIGS. 2 and 5 above, the phase frequency detector 40 measures a phase difference between a received reference clock signal RCLK and a feedback clock signal VCLK. In response to the difference in phase between the clock signals, the phase frequency detector 40 generates an up control signal up and a down control signal dn, which are provided to the first charge pump 44. The first charge pump 44, in turn, generates a first current I1 which is applied to a first capacitor $C_p$ of a loop filter in response to the up control signal up and down control signal dn to charge and discharge the capacitor $C_p$. The first charge pump voltage $V_p$, or the voltage across the capacitor $C_p$, is provided as an input to the multiple-input operational amplifier 50 (in this case, a five-input operational amplifier) at a positive input terminal. In addition, the up control signal up is provided directly to a positive input terminal of the multiple-input operational amplifier 50 and the down control signal dn is provided directly to a negative input terminal of the multiple-input operational amplifier 50. Also, as in the first and second embodiments above, a negative feedback loop of the operational amplifier is provided between an output of the operational amplifier 50 at node $V_c$ and a negative input terminal of the operational amplifier 50.

The third embodiment of FIG. 6 further includes a pulse width filter (PWF) 42 and a second charge pump 46. The pulse width filter 42 receives the up control signal up and down control signal dn, and, in turn, generates an auxiliary up control signal aup and an auxiliary down control signal adn. The auxiliary up control signal aup and the auxiliary down control signal adn are applied to the second charge pump 46, which outputs second current signal I2 which, along with the first current signal I1 of the first charge pump 44, is applied to the first capacitor $C_p$ of the loop filter in response to the auxiliary up control signal aup and auxiliary down control signal adn to charge and discharge the capacitor $C_p$ 1 Thus, the first combined current Ia applied to the capacitor $C_p$ is equal to the combined output currents of the first and second charge pumps, Ia=I1+I2.

The auxiliary up control signal aup and auxiliary down control signal adn are further provided to a control signal generator 48 that, in response, generates a control signal con. In one embodiment, the control signal generator 48 comprises an OR gate. The control signal con is in turn applied to both a positive input terminal and a negative input terminal of the multiple-input operational amplifier 50. When the phase error of the input signal is large, the first combined current Ia is increased due to the large increase in the second current signal I2. The loop bandwidth of the PLL is also increased due to the increase in the level of the second current signal I2. In this case, to ensure stable operation, the zero position of the PLL should also be increased, which means that the amount of offset in the operational amplifier should be decreased. By applying the control signal con to the positive and negative input terminals of the operational amplifier 50 under these conditions, this reduces the amount of offset in the operational amplifier by increasing the effective width of the input transistors N3, N6.

Figure 7:
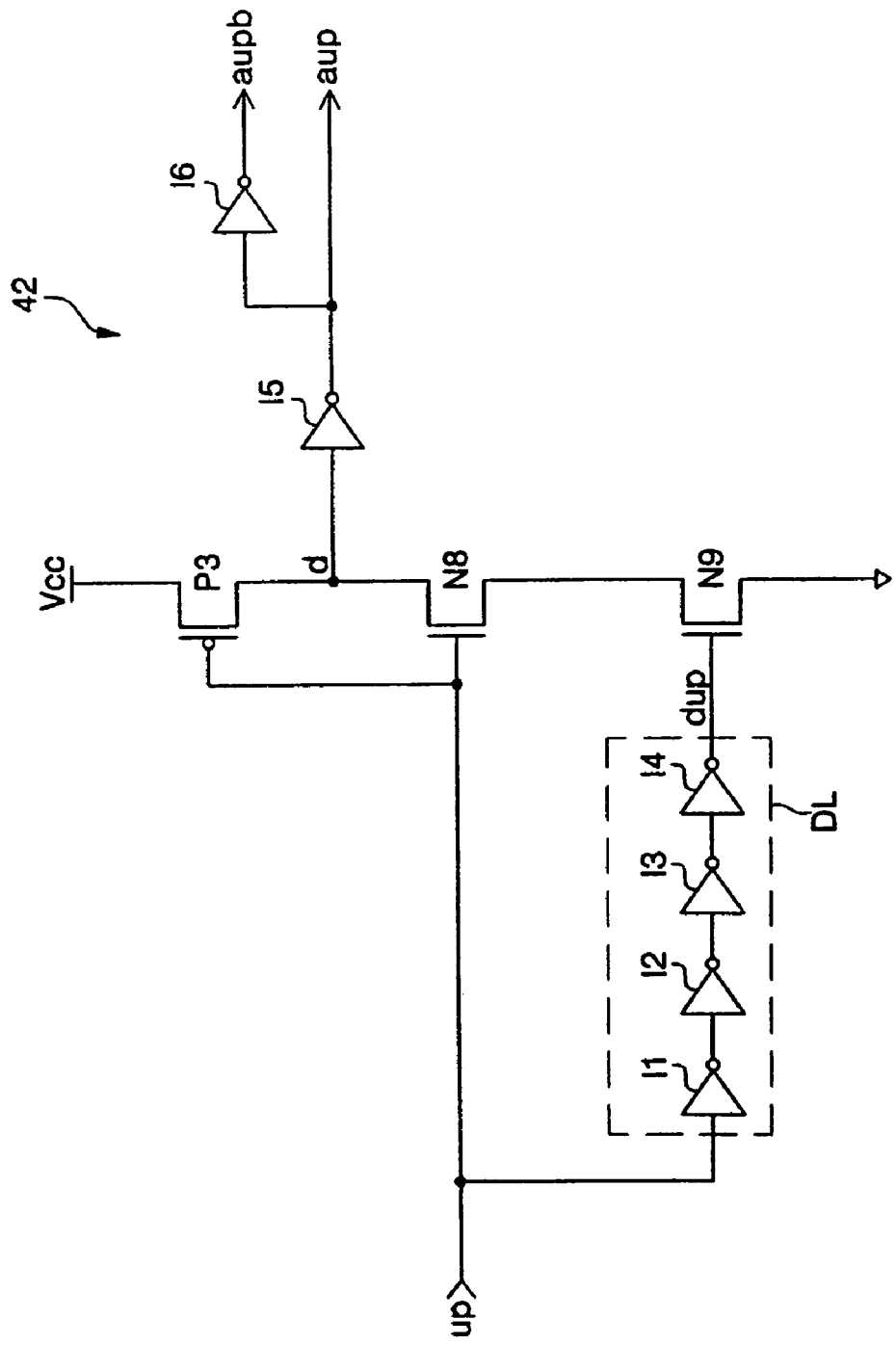
FIG. 7 is a detailed schematic diagram of the pulse width filter (PWF) of the third phase locked loop embodiment of FIG. 6, in accordance with the present invention.

FIG. 7 is a detailed schematic diagram of the pulse width 4 filter (PWF) 42 of the third phase locked loop embodiment of FIG. 6, in accordance with the present invention. In FIG. 7, an exemplary pulse width filter 42 that receives the up control signal up and generates an auxiliary up control signal aup is presented. A similar circuit can be used for processing the down control signal dn to generate an auxiliary down control signal adn.

In this embodiment, a third PMOS transistor P3, and eighth and ninth NMOS transistors N8, N9 are connected serially between the voltage source Vcc and the ground reference voltage. A delay circuit DL including a plurality of inverters I1, I2, I3, I4 delay the up control signal up, and apply a resulting delayed up signal dup to the gate of the ninth NMOS transistor N9. The up control signal up is applied to the gates of the third PMOS transistor P3 and the eighth NMOS transistor N8. A signal at a node d between the third PMOS transistor P3 and the eighth NMOS transistor N8 is applied to a fifth inverter I5, the output of which is the auxiliary up control signal aup. The auxiliary up control signal aup is further applied to a sixth inverter I6, the output of which is an inverted auxiliary up control signal aup.

The pulse width filter of FIGS. 6 and 7 enables locking of the phase locked loop at an accelerated pace. When the up control signal is active, and has at least a predetermined pulse width, the transistors N8 and N9 are activated at the same time. Thus, the resulting auxiliary up control signal aup, is of a short pulse duration, the length of which is the difference in pulse length between the duration of the up control signal up less the predetermined delay length of the delay circuit DL. The delay length of the delay circuit is controlled by the number of inverters included in the delay chain. The same operation applies to generation of the auxiliary down control signal adn.

Figure 8A:
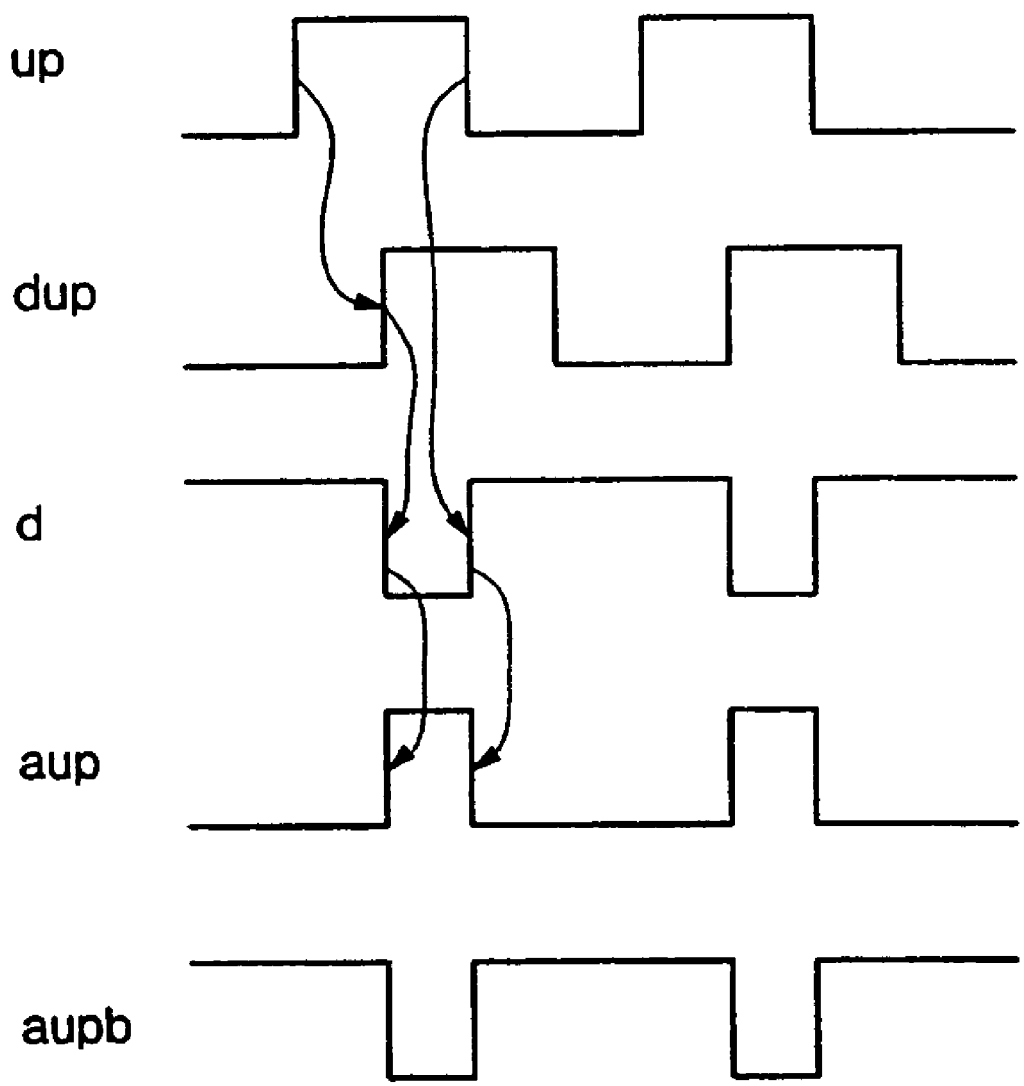
FIG. 8A is a first timing diagram of signals of the pulse width filter of the third phase locked loop embodiment of FIG. 2, in the case where the reference clock signal leads the output clock signal, in accordance with the present invention.

FIG. 8A is a first timing diagram of signals of the pulse width filter 42 of the third phase locked loop embodiment of FIG. 2, in the case where the reference clock signal leads the feedback clock signal, in accordance with the present invention. In this case, at the rising edge of the up control signal up, the delayed up control signal dup is activated following the predetermined delay of the inverter chain. At activation of the delayed up signal dup, the up control signal up is still active, and therefore, the signal at node d is changed from a high level to a low level, and the corresponding auxiliary up control signal aup, become active at a high level. The auxiliary up control signal aup remains active until the up control signal up becomes inactive, at its falling edge.

Figure 8B:
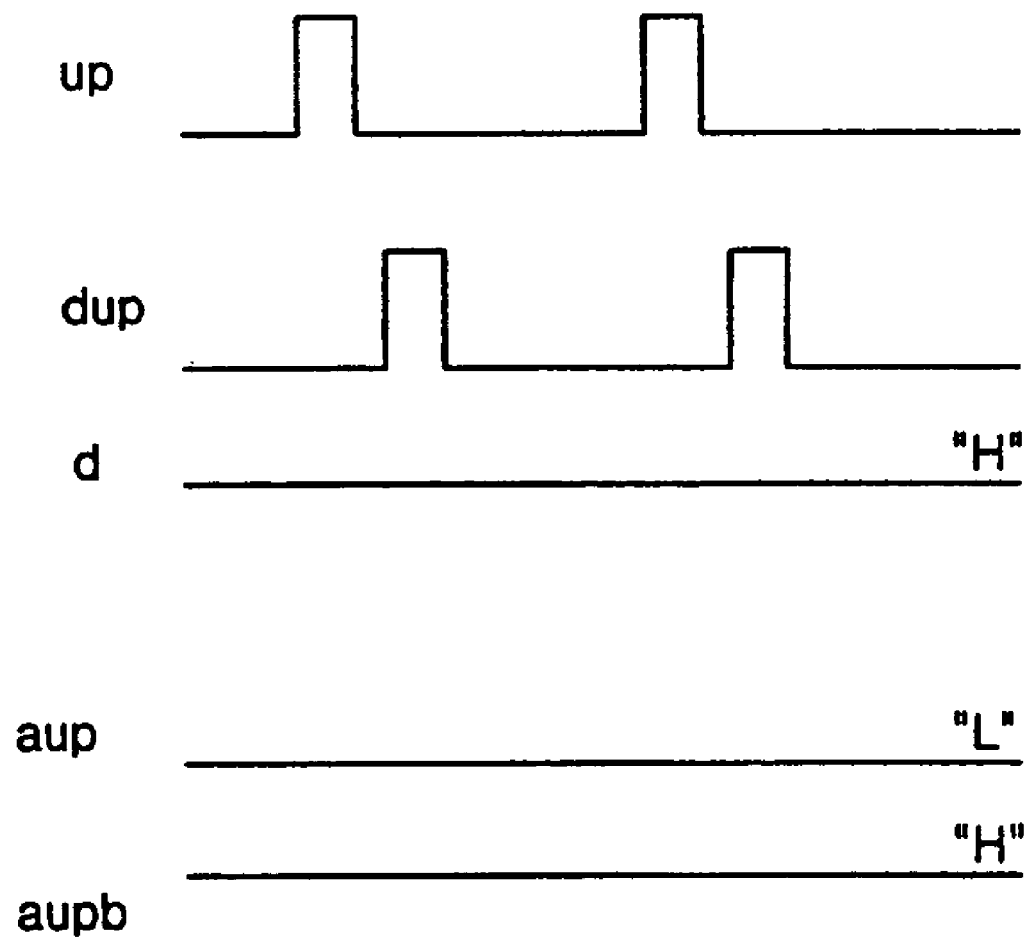
FIG. 8B is a second timing diagram of signals of the pulse width filter of the third phase locked loop embodiment of FIG. 2, in the case where the reference clock signal lags the output clock signal, in accordance with the present invention.

FIG. 8B is a second timing diagram of signals of the pulse width filter 42 of the third phase locked loop embodiment of FIG. 2, in the case where the reference clock signal lags the output clock signal, in accordance with the present invention. In this case, the up control signal is a relatively short pulse, and does not remain active long enough to span the delay of the delay circuit DL. For this reason, the signal at node d is not changed to a low level, and accordingly, the auxiliary up control signal aup does not become active. In this case, assuming the down control signal dn is activated, the corresponding auxiliary down control signal adn becomes activated for a short pulse duration in a manner similar to the auxiliary up control signal aup of FIG. 8A.

Figure 9A:
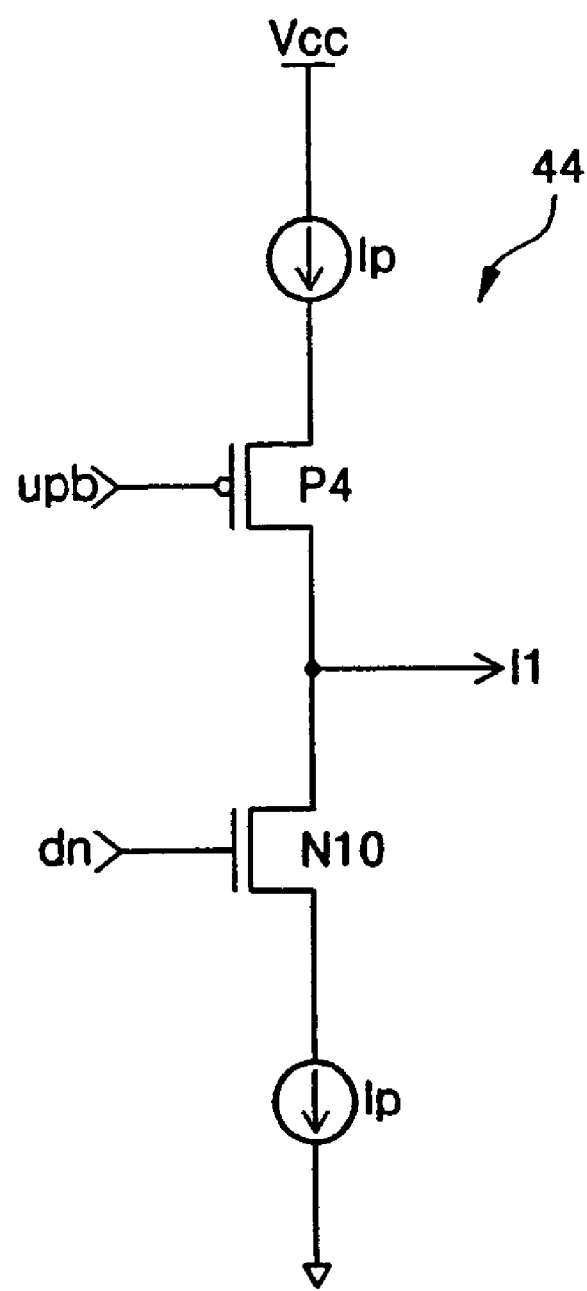
FIGS. 9A and 9B are detailed schematic diagrams of the first 44 and second 46 charge pumps (CP) respectively of the third phase locked loop embodiment of FIG. 6, in accordance with the present invention.
Figure 9B:
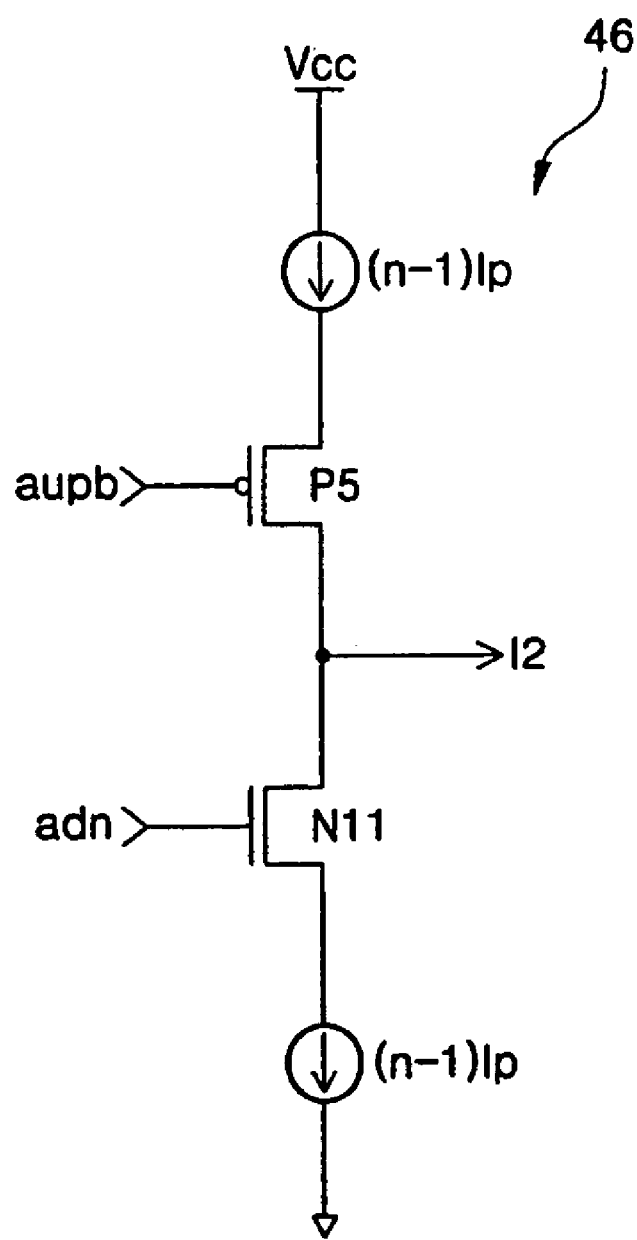

FIGS. 9A and 9B are detailed schematic diagrams of the first 44 and second 46 charge pumps (CP) respectively of the third phase locked loop embodiment of FIG. 6, in accordance with the present invention. The first charge pump 44 of FIG. 9A includes a first current source Ip, a fourth PMOS transistor P4, a tenth NMOS transistor N10 and a second current source Ip in series between the voltage source Vcc and the ground voltage. An inverted up control signal upb is applied to a gate of the fourth PMOS transistor P4 and the down control signal dn is applied to a gate of the tenth NMOS transistor N10. The signal at a node between the fourth PMOS transistor P4 and the tenth NMOS transistor N10 is provided as the first current I1. The charge pump 44 of FIG. 9A is applicable as the first charge pump 44 of FIG. 6 and as the charge pump 22 of FIG. 2 and FIG. 5 (and as charge pump 64 of FIG. 11, discussed below).

The second charge pump 46 of FIG. 9B includes a third current source (n−1)Ip, a fifth PMOS transistor P5, an eleventh NMOS transistor N11 and a fourth current source (n−1)Ip in series between the voltage source Vcc and the ground voltage. An inverted auxiliary up control signal aupb is applied to a gate of the fifth PMOS transistor P5 and the auxiliary down control signal adn is applied to a gate of the eleventh NMOS transistor N11. The third and fourth current sources (n−1)Ip are preferably larger in size than the first and second current sources Ip, thus the value n is greater than 2. The signal at a node between the fifth PMOS transistor P5 and the eleventh NMOS transistor N11 is provided as the first current I2. The charge pump 46 of FIG. 9B is applicable as the charge pump 46 of FIG. 6 (and as the second charge pump 68 of FIG. 11, discussed below).

Figure 10:
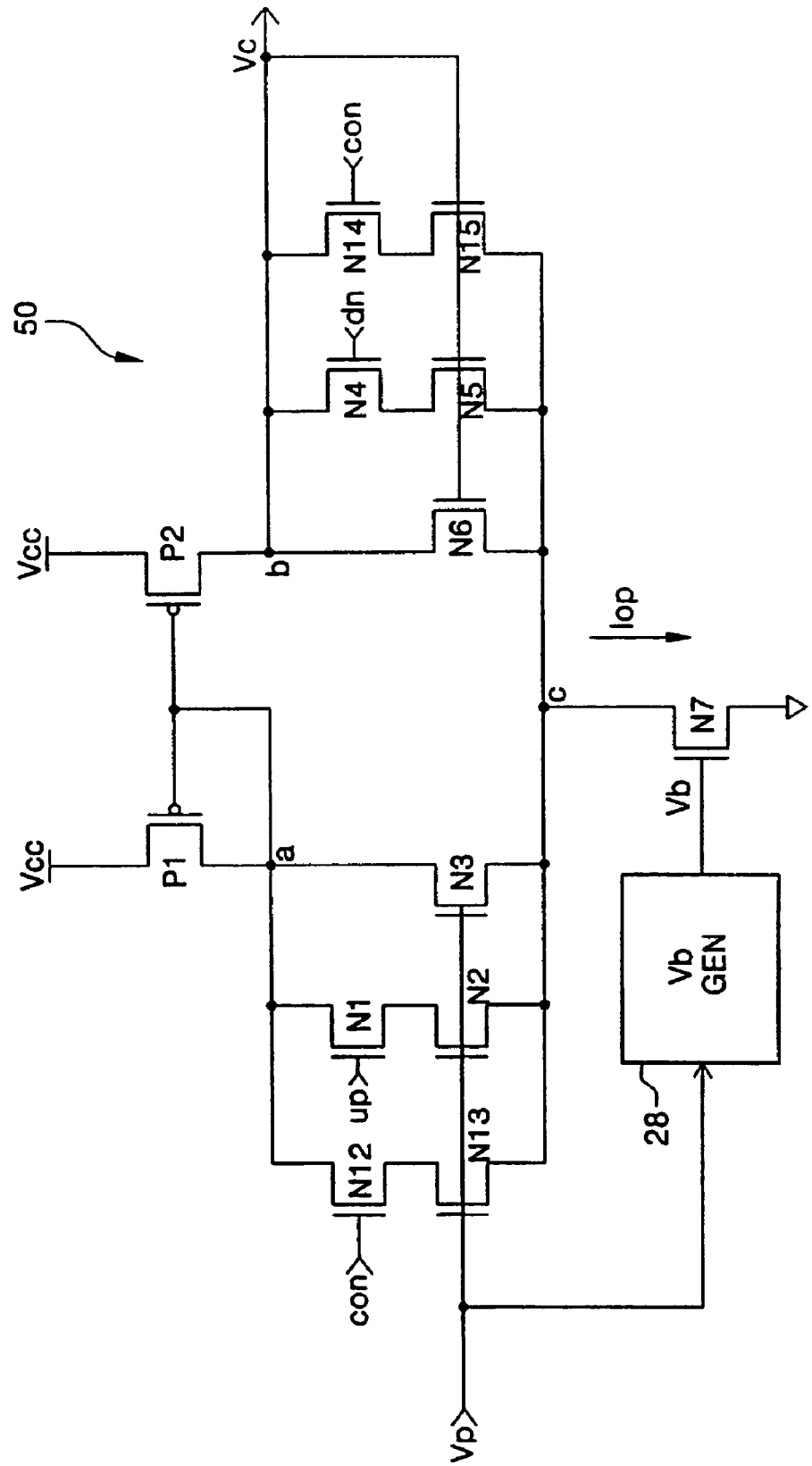
FIG. 10 is a detailed schematic diagram of the operational amplifier of the third phase locked loop embodiment of FIG. 6, in accordance with the present invention.

FIG. 10 is a detailed schematic diagram of an embodiment of the operational amplifier 50 of the third phase locked loop embodiment of FIG. 6, in accordance with the present invention. The operational amplifier 50 of FIG. 10 is similar in structure and operation to the operational amplifier 24 of FIG. 3, in that it includes the first and second PMOS transistors P1, P2, the first through seventh NMOS transistors N1, N2, ..., N7, and the bias voltage generator 28. In addition, the operational amplifier 50 further includes a twelfth NMOS transistor N12 and a thirteenth NMOS transistor N13 coupled in series between the first node a and the third node c. Also, a fourteenth NMOS transistor N14 and a fifteenth NMOS transistor N15 are coupled in series between the second node b and the third node c. The control signal con is applied to a gate of the twelfth NMOS transistor N12 (i.e., a positive input terminal of the operational amplifier 50), and to a gate of the fourteenth NMOS transistor N14 (i.e., a negative input terminal of the operational amplifier 50). The charge pump voltage $V_p$, or the voltage across the capacitor $C_p$, is applied to the gates of NMOS transistors N13, N2 and N3. The output voltage $V_c$ is applied to the gates of NMOS transistors N15, N5 and N6.

The above-described third embodiment of FIGS. 6–10 allows for first and second modes of operation in the phase locked loop 41. When the phase locked loop 41 is in a first mode of operation, the input clock PCLK and feedback clock VCLK signals are substantially locked and therefore have a relatively small frequency difference and relatively small phase difference. Accordingly, the up control signal up and the down control signal dn have a relatively short pulse. With short pulses in the up and down control signals up, dn, the auxiliary up and auxiliary down control signals aup, adn, are not activated, and therefore operation of the second charge pump 46 and the control signal generator 48 is disabled.

When the phase locked loop 41 is however in a second mode of operation, the input clock PCLK and feedback clock VCLK signals have a relatively large frequency difference and/or relatively large phase difference. Accordingly, the up control signal up or the down control signal dn has a relatively large pulse width. With a large pulse width in the up or down control signal up, dn, the corresponding auxiliary up and auxiliary down control signal aup, adn, is activated, and therefore operation of the second charge pump 46 and the control signal generator 48 is enabled. Thus, in the second mode of operation, both first and second charge pumps 44, 46, are activated. In this mode, the second current I2 is generated by the second charge pump 46 of a value that is larger than the value of the first current I1 (a positive value in the case of the up control signal up being generated, and a negative value in the case of the down control signal dn being generated). Thus, the first combined current Ia applied to the capacitor $C_p$, is much larger in this case for more rapidly charging (in the case of an up control signal up being generated) or discharging (in the case of a down control signal dn being generated) the capacitor $C_p$. Accordingly the voltage $V_p$ changes at a greater rate, and thus the output voltage $V_c$ changes at a greater rate. In this manner, the response time for locking the input clock PCLK and the feedback clock VCLK in the present embodiment is much improved.

Figure 11:
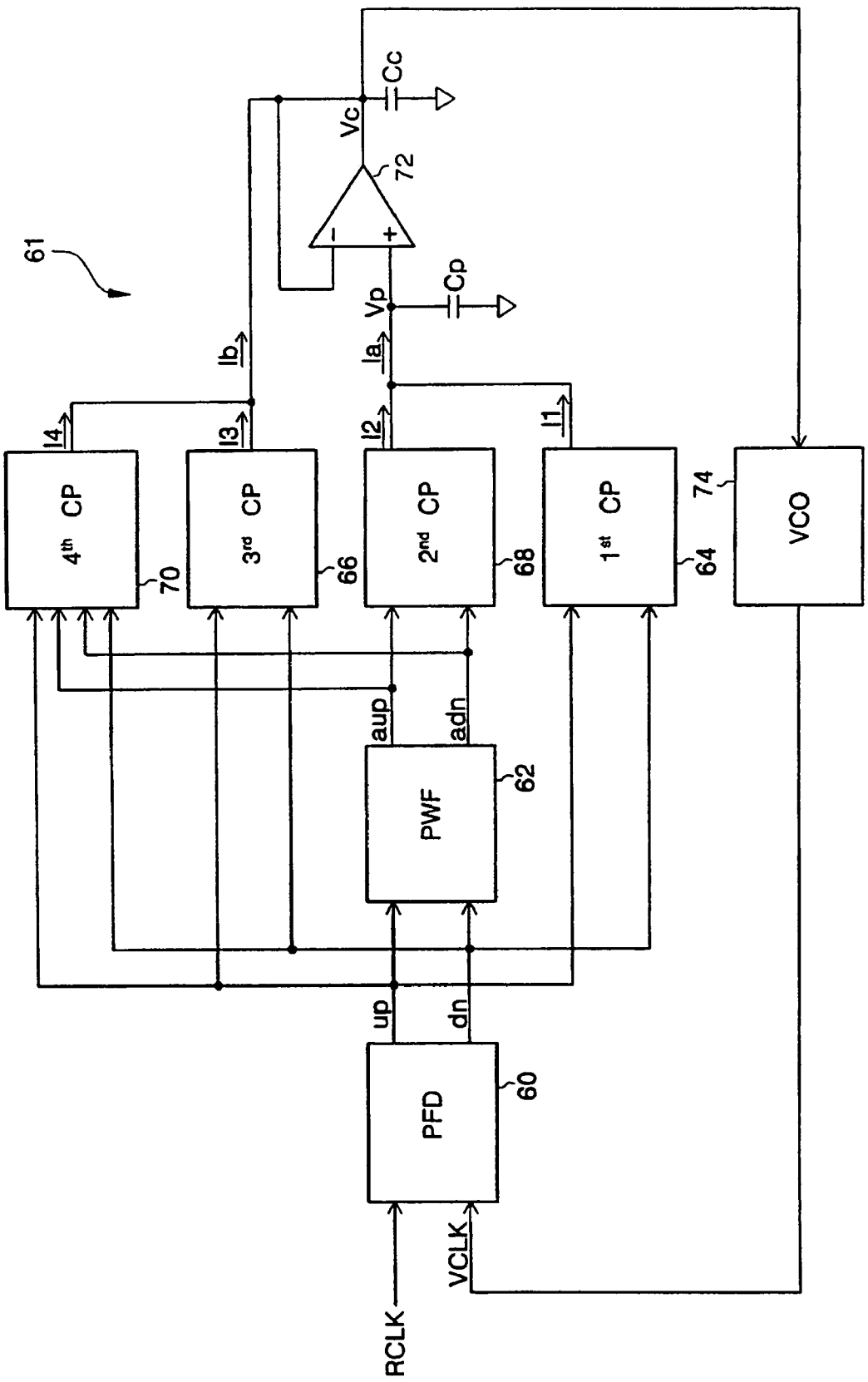
FIG. 11 is a block diagram of a fourth embodiment of a phase locked loop configuration in accordance with the present invention.

FIG. 11 is a block diagram of a fourth embodiment of a phase locked loop configuration in accordance with the present invention. In this embodiment, the phase locked loop circuit 61 includes a phase frequency detector (PFD) 60, a first charge pump (CP) 64, an operational amplifier 72, and a voltage controlled oscillator (VCO) 74. As in the first, second, and third embodiments of FIGS. 2, 5, and 6 above, the phase frequency detector 60 measures a phase difference between a received reference clock signal RCLK and a feedback clock signal VCLK. In response to the difference in phase between the clock signals, the phase frequency detector 60 generates an up control signal up and a down control signal dn, which are provided to the first charge pump 64. The first charge pump 64, in turn, generates a first current I1 which is applied to a first capacitor $C_p$ of a loop filter in response to the up control signal up and down control signal dn to charge and discharge the capacitor $C_p$. The first charge pump voltage $V_p$, or the voltage across the capacitor $C_p$, is provided as an input to the operational amplifier 72 (in this case, a two-input operational amplifier) at a positive input terminal. Also, as in the first, second, and third embodiments above, a negative feedback loop of the operational amplifier is provided between an output of the operational amplifier 72 and a negative input terminal of the operational amplifier 72.

As in the third embodiment of FIG. 6, the fourth embodiment of FIG. 11 further includes a pulse width filter (PWF) 62 and a second charge pump 68. The pulse width filter 42 receives the up control signal up and down control signal dn, and, in turn, generates the auxiliary up control signal aup and the auxiliary down control signal adn, in the manner described above. The auxiliary up control signal aup and the auxiliary down control signal adn are provided to the second charge pump 68, which provides a second current I2 which, in combination with the first current I1 of the first charge pump 64, is applied as first combined current Ia to the first capacitor $C_p$ of the loop filter in response to the auxiliary up control signal aup and auxiliary down control signal adn to charge and discharge the capacitor $C_p$. Thus, the first combined current Ia applied to the capacitor $C_p$ is equal to the combined output currents of the first and second charge pumps, Ia=I1+I2.

The up control signal up and down control signal dn are further provided to a third charge pump 66, which generates an output current I3, The up control signal up, down control signal dn, auxiliary up control signal aup and auxiliary down control signal adn are further applied to a fourth charge pump 70 which generates a fourth output current I4. The second combined current Ib of the third output current I3 and fourth output current I4 is applied to the second capacitor $C_c$ at the output node of the operational amplifier 72, Ib=I3+I4.

Figure 12A:
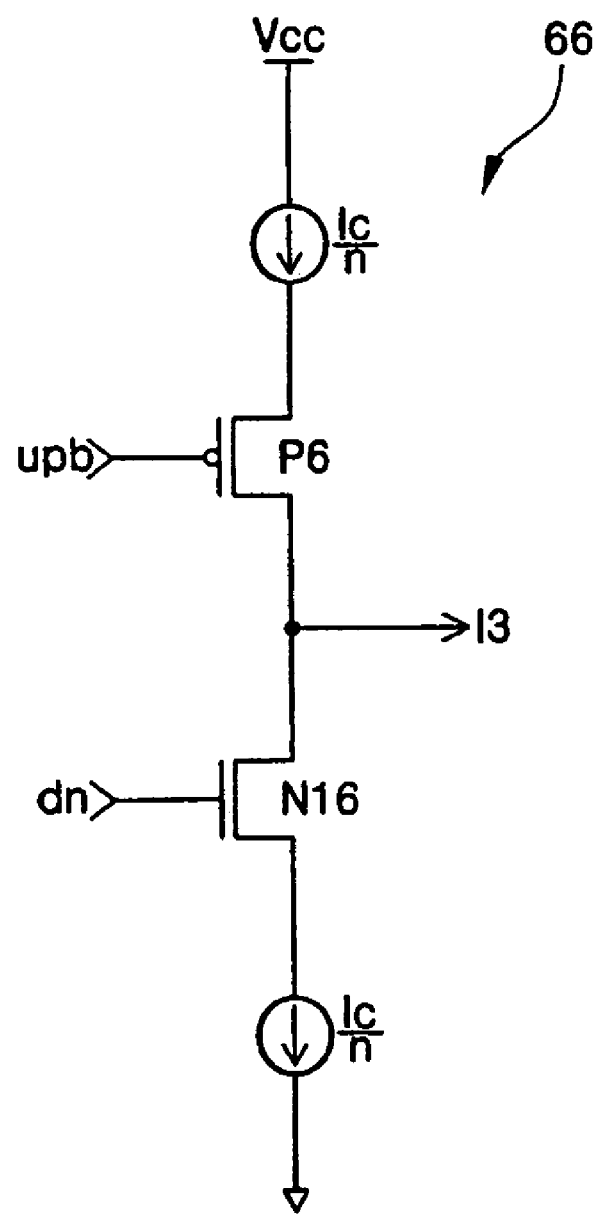
FIGS. 12A and 12B are detailed schematic diagrams of the third and fourth charge pumps respectively of the fourth phase locked loop embodiment of FIG. 11, in accordance with the present invention.
Figure 12B:
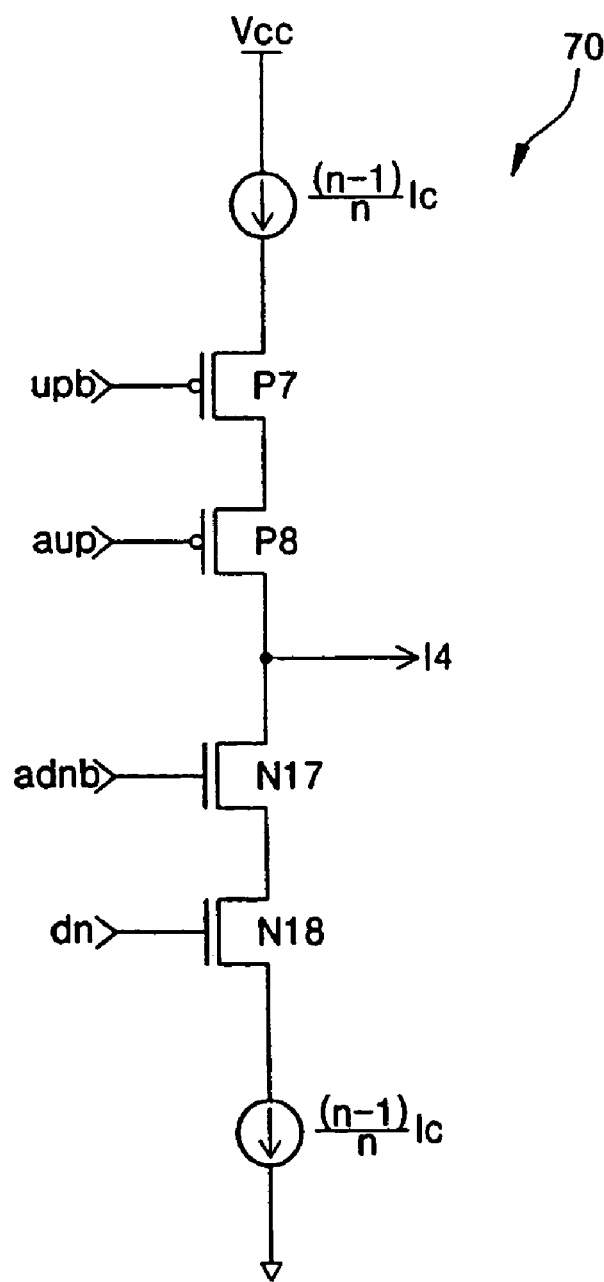

FIGS. 12A and 12B are detailed schematic diagrams of the third and fourth charge pumps 66, 70 respectively of the fourth phase locked loop embodiment of FIG. 11, in accordance with the present invention. The third charge pump 66 of FIG. 12A includes a fifth current source Ic/n, a sixth PMOS transistor P6, a sixteenth NMOS transistor N16 and a sixth current source Ic/n in series between the voltage source Vcc and the ground voltage. An inverted up control signal uph is applied to a gate of the sixth PMOS transistor P6 and the down control signal dn is applied to a gate of the sixteenth NMOS transistor N16. The signal at a node between the sixth PMOS transistor P6 and the sixteenth NMOS transistor N16 is provided as the third current I3. The current value Ic represents the sum of the output currents of the third charge pump 66 and the fourth charge pump 70 when the auxiliary up control signal aup and auxiliary down control signal adn are each deactivated. This case is discussed with reference to FIGS. 13A_1 and 13A_2 below. In this case Ib=Ic. The current value Ic/n represents the sum of the output currents of the third charge pump 66 and the fourth charge pump 70 when one of the auxiliary up control signal aup and auxiliary down control signal adn is activated. This case is discussed with reference to FIGS. 13B_1 and 13B_2 below. In this case Ib=Ic/n, because only the third charge pump 66 is activated, and not the fourth charge pump 70.

The fourth charge pump 70 of FIG. 12B includes a seventh current source ((n−1)/n)Ic, a seventh PMOS transistor P7, an eighth PMOS transistor P8, a seventeenth NMOS transistor N17, an eighteenth NMOS transistor N18 and a eighth current source ((n−1)/n)Ic in series between the voltage source Vcc and the ground voltage. An inverted up control signal upb is applied to a gate of the seventh PMOS transistor P7, the auxiliary up control signal aup is applied to a gate of the eighth PMOS transistor P8, an inverted auxiliary down control signal adnb is applied to a gate of the seventeenth NMOS transistor N17 and the down control signal dn is applied to a gate of the eighteenth NMOS transistor N18. The seventh and eighth current sources ((n−1)/n)Ic are preferably larger in size than the fifth and sixth current sources Ic/n, thus the value n is greater than 2. The signal at a node between the eighth PMOS transistor P8 and the seventeenth NMOS transistor N17 is provided as the fourth current I4.

FIGS. 13A_1 and 13A_2 are timing diagrams of signals of the fourth phase locked loop embodiment of FIG. 11, illustrating the first mode of operation of the fourth embodiment, in accordance with the present invention. FIGS. 13B_1 and 13B_2 are additional timing diagrams of signals of the fourth phase locked loop embodiment of FIG. 11, illustrating the first and second modes of operation of the fourth embodiment, in accordance with the present invention.

With reference to FIG. 13A_1, in a first mode of operation, the reference clock signal RCLK leads the feedback clock signal VCLK by a small amount, in accordance with the present invention. In this case, the up control signal up is a relatively short pulse, and does not remain active long enough to span the delay of the delay circuit DL of the pulse width filter 62. For this reason, the auxiliary up control signal aup does not become active, as described above. The first combined positive current signal Ia is provided in this case solely by the first charge pump 64, as the second charge pump 68 is inactive. The level of the first combined current signal Ia is equal to Ip. The second combined positive current signal Ib is provided in this case by the combined currents I3, I4 of the third charge pump 66 and the fourth charge pump 70 which are both active. The level of the second combined current signal Ib is thus equal to Ic.

With reference to FIG. 13A_2, in the first mode of operation, the reference clock signal RCLK lags the feedback clock signal VCLK by a small amount, in accordance with the present invention. In this case, the down control signal dn is a relatively short pulse, and does not remain active long enough to span the delay of the delay circuit DL of the pulse width filter 62. For this reason, the auxiliary dn control signal adn does not become active, as described above. The first combined negative current signal Ia is provided in this case solely by the first charge pump 64, as the second charge pump 68 is inactive. The level of the first combined current signal Ia is equal to −Ip. The second combined negative current signal Ib is provided in this case by the combined negative currents I3, I4 of the third charge pump 66 and the fourth charge pump 70 which are both active. The level of the second combined current signal Ib is thus equal to −Ic.

With reference to FIG. 13B_1, in a second mode of operation, the reference clock signal RCLK leads the feedback clock signal VCLK by a relatively large amount, in accordance with the present invention. In this case, the up control signal up is a relatively large pulse, and remains active for a long enough time period to span the delay of the delay circuit DL of the pulse width filter 62. For this reason, the auxiliary up control signal aup becomes active, as described above. During a first time period T1, the phase locked loop 61 operates in the first mode of operation described above, because the auxiliary up control signal aup has not yet become active. During a second time period T2, following the first time period, the phase locked loop 61 operates in a second mode of operation, initiated by the rising edge of the auxiliary up control signal aup.

Still referring to FIG. 13B_1, during the first time period T1, the first combined positive current signal Ia is provided solely by the first charge pump 64, as the second charge pump 68 is initially inactive. The level of the first combined current signal Ia is equal to Ip during this time period. In addition, during the first time period T1, the second combined positive current signal Ib is provided by the combined currents I3, I4 of the third charge pump 66 and the fourth charge pump 70 which are both active. The level of the second combined current signal Ib is thus equal to Ic during this time period.

Still referring to FIG. 13B_1, during the second time period T2, the first combined positive current signal Ia is provided by both the first charge pump 64 and the second charge pump 68, as the second charge pump 68 has become active. The level of the first combined current signal Ia is equal to the combination of Ip, which is the output I1 of the first charge pump 64, and (n−1)Ip, which is the output I2 of the second charge pump 68 during this time period, which is a combined total current of (n)Ip. In addition, during the second time period, the second combined positive current signal Ib is provided in this case solely by current I3 of the third charge pump 66 which is active during this time period, and not by the fourth charge pump 70, which has become inactive during this time period. The level of the second combined current signal Ib is thus equal to Ic/n during this time period.

With reference to FIG. 13B_2, in a second mode of operation, the reference clock signal RCLK lags the feedback clock signal VCLK by a relatively large amount, in accordance with the present invention. In this case, the down control signal dn is a relatively large pulse, and remains active for a long enough time period to span the delay of the delay circuit DL of the pulse width filter 62. For this reason, the auxiliary down control signal adn becomes active, as described above. During a first time period T1, the phase locked loop 61 operates in the first mode of operation described above, because the auxiliary down control signal adn has not yet become active. During a second time period T2, following the first time period, the phase locked loop 61 operates in the second mode of operation, initiated by the rising edge of the auxiliary down control signal adn.

Still referring to FIG. 13B_2, during the first time period T1, the first combined negative current signal Ia is provided solely by the first charge pump 64, as the second charge pump 68 is initially inactive. The level of the first combined negative current signal Ia is equal to −Ip during this time period. In addition, during the first time period T1, the second combined negative current signal Ib is provided by the combined currents I3, I4 of the third charge pump 66 and the fourth charge pump 70 which are both active. The level of the second combined current signal Ib is thus equal to −Ic during this time period.

Still referring to FIG. 13B_2, during the second time period T2, the first combined negative current signal Ia is provided by both the first charge pump 64 and the second charge pump 68, as the second charge pump 68 has become active. The level of the first combined current signal Ia is equal to the combination of −Ip, which is the output I1 of the first charge pump 64, and −(n−1)Ip, which is the output I2 of the second charge pump 68 during this time period, which is a combined total current of −(n)Ip. In addition, during the second time period, the second combined negative current signal Ib is provided in this case solely by current I3 of the third charge pump 66 which is active during this time period, and not by the fourth charge pump 70, which has become inactive during this time period. The level of the second combined current signal Ib is thus equal to −Ic/n during this time period.

In this manner, during a first mode of operation of the fourth embodiment of the present invention, when the input clock RCLK and feedback clock VCLK are relatively similar in phase and frequency, and are therefore substantially locked, the second charge pump 68 is inactive, and the first, third, and fourth charge pumps 64, 66, 70 are active. Thus, the first combined current Ia is relatively small, and the second combined current Ib is relatively large.

In contrast, when the input clock RCLK and feedback clock are dissimilar in phase and frequency, the auxiliary up/down control signals are activated, for a time period during which the phase locked loop enters a second mode of operation. When operating in the second mode, the first, second and third charge pumps 64, 68, 66, are active, and the fourth charge pump 70 is inactive. Thus, in the second mode, the first combined current Ia is relatively large, and the second combined current Ib is relatively small.

In this manner, the offset voltage of the operational amplifier 72 is controlled by application of the second combined current signal Ib. This has a similar affect on the operation of the operational amplifier to that of the con signal applied in the FIG. 6 embodiment above.

Figure 14:
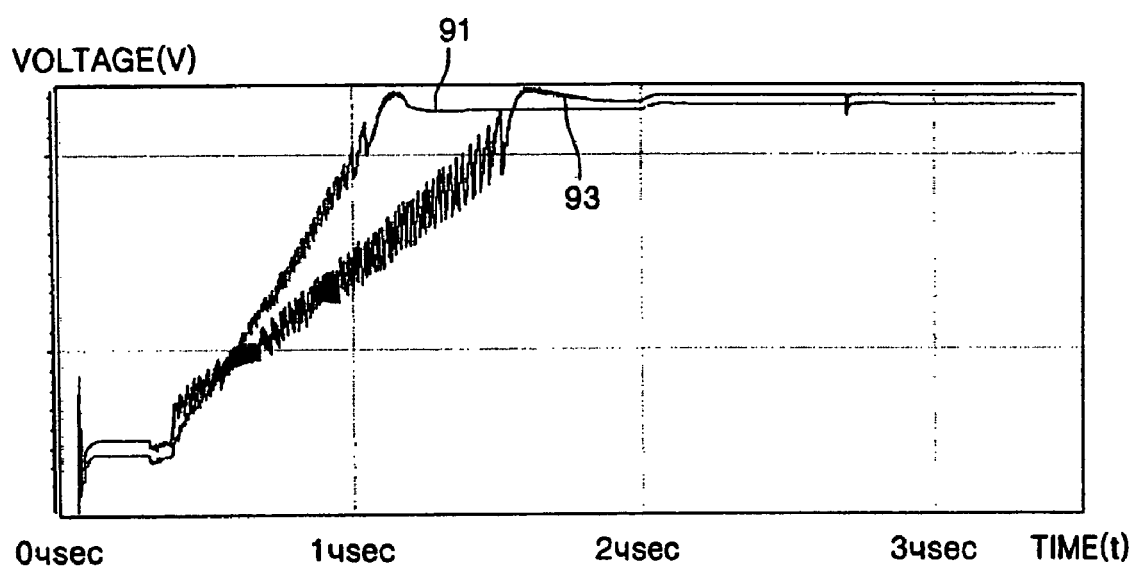
FIG. 14 is a waveform diagram, illustrating the step response of the third phase locked loop embodiment of FIG. 6, in accordance with the present invention, as compared to the response of the conventional apparatus.

FIG. 14 is a waveform diagram, illustrating the step response of the third phase locked loop embodiment of FIG. 6, in accordance with the present invention, as compared to the response of the conventional apparatus. It can be seen in this diagram that locking is achieved in the response of the present invention 91 at a faster rate than that of the conventional embodiment 93. In addition, once locking is achieved, a steady state of operation is achieved at a faster rate by the embodiment of the present invention.

The present invention is applicable to integrated circuits of all types, including memory devices and memory systems. In a memory device embodiment, the memory device includes a plurality of addressable memory cells, each cell comprising a data storage element. A decoder receives an address from an external source, and that generates a row signal and a column signal for accessing at least one of the addressable memory cells. A phase locked loop configured in accordance with embodiments of the present invention can be provided on the memory device for receiving signals that are transmitted from external, off-chip sources.

Figure 15:
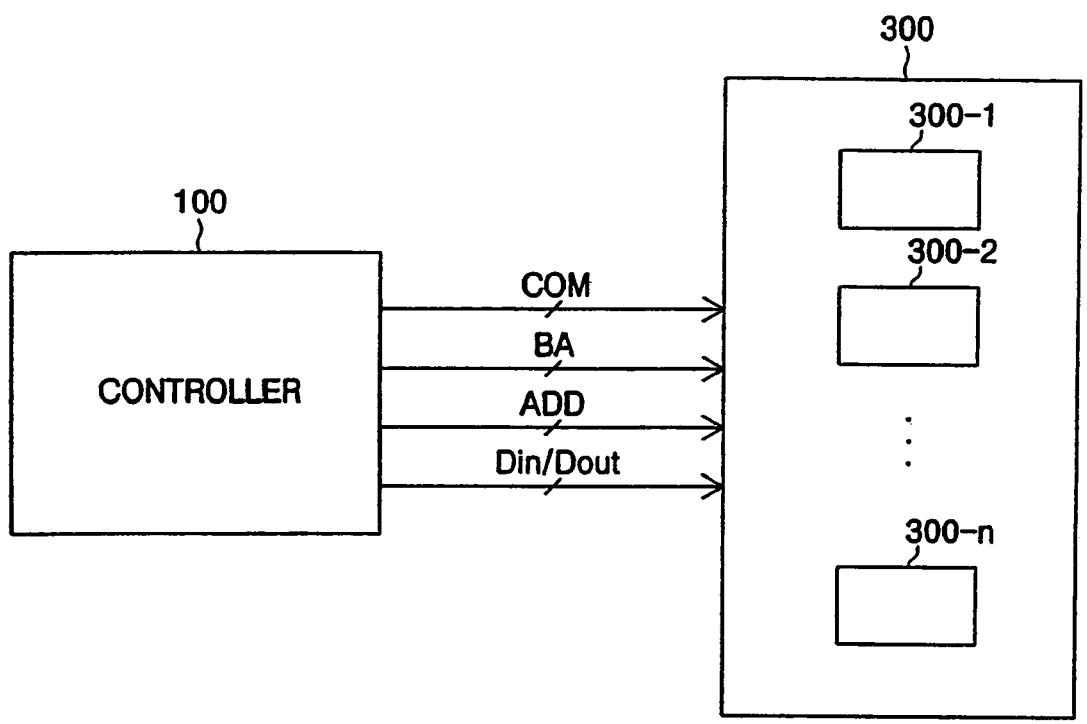
FIG. 15 is a block diagram of a memory system in accordance with the present invention.

FIG. 15 is a block diagram of a memory system in accordance with the present invention. The memory system includes a memory controller 100 that generates command (COM) and address signals (BA (bank address) and ADD) and a memory module 300. The memory module 300 comprises a plurality of memory devices 300-1, 300-2, ..., 300-n, and receives the command (COM) and address signals (BA, ADD). In response, the memory module 300 stores and retrieves data (Din/Dout) to and from the memory devices 300-1, 300-2, ..., 300-n. A phase locked loop in accordance with the present invention can be provided on the memory devices for receiving signals that are transmitted from external, off-chip sources.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A phase locked loop comprising:
a first charge pump that receives first and second control signals generated in response to a comparison of phases of a reference clock signal and a feedback signal and that, in response, generates a first charge pump signal;
a loop filter comprising an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs; and
a voltage controlled oscillator that receives the control voltage signal and, in response, generates the feedback clock signal.

2. The phase locked loop of claim 1 further comprising a phase detector that receives the reference clock signal and the feedback clock signal, compares their respective phases, and generates the first and second control signals in response to the comparison.

3. The phase locked loop of claim 1 further comprising a phase frequency detector that receives the reference clock signal and the feedback clock signal, compares their respective phases and frequencies, and generates the first and second control signals in response to the comparison.

4. The phase locked loop of claim 1 wherein the first control signal comprises an up control signal and wherein the second control signal comprises a down control signal.

5. The phase locked loop of claim 1 wherein the first control signal is activated in response to the rising edge of the reference clock signal and the second control signal is activated in response to the rising edge of the feedback clock signal.

6. The phase locked loop of claim 1 wherein the operational amplifier comprises:
- a first transistor, coupled between a first voltage supply and a first node, and a gate of which is coupled to a drain of which at a first node;
- a second transistor, coupled between the first voltage supply and a second node, and a gate of which is coupled to the first node;
- a third transistor and a fourth transistor coupled in series between the first node and a third node, a gate of one of the third and fourth transistors being coupled to the first control signal and a gate of the other of the third and fourth transistors being coupled to the first charge pump signal;
- a fifth transistor, coupled between the first node and the third node, and a gate of which is coupled to the first charge pump signal;
- a sixth transistor and a seventh transistor coupled in series between the second node and the third node, a gate of one of the sixth and seventh transistors being coupled to the second control signal and a gate of the other of the sixth and seventh transistors being coupled to the control voltage signal;
- an eighth transistor, coupled between the second node and the third node, a gate of which is coupled to the control voltage signal; and
- a ninth transistor, coupled between the third node and a ground reference voltage, and a gate of which receives a voltage bias signal.

7. The phase locked loop of claim 6 wherein the first and second transistors comprise PMOS transistors, and wherein third, fourth, fifth, sixth, seventh, eighth, and ninth transistors comprise NMOS transistors.

8. The phase locked loop of claim 6 wherein the voltage bias signal is derived from the first charge pump signal.

9. The phase locked loop of claim 1 wherein the first charge pump comprises a first current source and a first charge pump transistor in series between a first voltage supply and a first node, and a second charge pump transistor and a second current source in series between the first node and a ground reference voltage, the first charge pump transistor being activated in response to the first control signal and the second charge pump transistor being activated in response to the second control signal, the first charge pump providing the charge pump signal at the first node.

10. The phase locked loop of claim 9 wherein the first charge pump transistor comprises a PMOS transistor and wherein the first control signal comprises an inverted up control signal; wherein the second charge pump transistor comprises an NMOS transistor and wherein the second control signal comprises a down control signal.

11. The phase locked loop of claim 1 wherein the operational amplifier of the loop filter comprises a first operational amplifier and wherein the control voltage generated by the first operational amplifier comprises a first control voltage, and further comprising a second operational amplifier that receives the first control voltage at a first input and that generates a second control voltage that is provided to the voltage controlled oscillator, a second input of the second operational amplifier receiving the second control voltage via a feedback path.

12. The phase locked loop of claim 1 further comprising:
- a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and
- a second charge pump that receives the first and second auxiliary control signals and, in response, generates an auxiliary charge pump signal, the auxiliary charge pump signal being applied to the first input of the operational amplifier in combination with the first charge pump signal.

13. The phase locked loop of claim 12 further comprising a control signal generator that receives the first and second auxiliary control signals and that, if either of the first and second auxiliary control signals is active, generates a third control signal, and wherein the operational amplifier includes a fifth input that receives the third control signal, and generates the control voltage further in response to the third control signal.

14. The phase locked loop of claim 13 wherein the control signal generator comprises an OR gate, a first input of which receives the first auxiliary control signal, a second input of which receives the second auxiliary control signal, and an output of which provides the third control signal.

15. The phase locked loop of claim 13 wherein the operational amplifier comprises:
- a first transistor, coupled between a first voltage supply and a first node, and a gate of which is coupled to a drain of which at a first node;
- a second transistor, coupled between the first voltage supply and a second node, and a gate of which is coupled to the first node;
- a third transistor and a fourth transistor coupled in series between the first node and a third node, a gate of one of the third and fourth transistors being coupled to the first control signal and a gate of the other of the third and fourth transistors being coupled to the first charge pump signal;
- an fifth transistor and a sixth transistor coupled in series between the first node and the third node, a gate of one of the fifth and sixth transistors being coupled to the third control signal and a gate of the other of the fifth and sixth transistors being coupled to the first charge pump signal;
- a seventh transistor, coupled between the first node and the third node, a gate of which is coupled to the first charge pump signal;
- an eighth transistor and a ninth transistor coupled in series between the second node and the third node, a gate of one of the eighth and ninth transistors being coupled to the second control signal and a gate of the other of the eighth and ninth transistors being coupled to the control voltage signal;
- a tenth transistor and an eleventh transistor coupled in series between the second node and the third node, a gate of one of the tenth and eleventh transistors being coupled to the third control signal and a gate of the other of the tenth and eleventh transistors being coupled to the control voltage signal;

a twelfth transistor, coupled between the second node and the third node, and a gate of which is coupled to the control voltage signal; and a thirteenth transistor, coupled between the third node and a ground reference voltage, and a gate of which receives a voltage bias signal.

16. The phase locked loop of claim 15 wherein the first and second transistors comprise PMOS transistors, and wherein third, fourth, fifth, sixth, seventh, eighth, ninth, tenth, eleventh, twelfth, and thirteenth transistors comprise NMOS transistors.

17. The phase locked loop of claim 12 wherein the pulse width filter comprises first, second and third transistors in series between a first voltage supply and a ground reference voltage, gates of the first and second transistors receiving one of the first and second control signals; a delay circuit receiving the one of the first and second control signals to generate a delayed control signal, the control signal being applied to a gate of the third transistor; a corresponding one of the first and second auxiliary control signals being provided at a node between the first and second transistors.

18. The phase locked loop of claim 12 wherein the second charge pump comprises a third current source and a third charge pump transistor in series between a first voltage supply and a second node, and a fourth charge pump transistor and a fourth current source in series between the second node and a ground reference voltage, the third charge pump transistor being activated in response to the first auxiliary control signal and the second charge pump transistor being activated in response to the second auxiliary control signal, the second charge pump providing the auxiliary charge pump signal at the second node.

19. The phase locked loop of claim 18 wherein the third charge pump transistor comprises a PMOS transistor and wherein the first auxiliary control signal comprises an inverted auxiliary up control signal and wherein the fourth charge pump transistor comprises an NMOS transistor and wherein the second control signal comprises the auxiliary down control signal.

20. The phase locked loop of claim 1 wherein the loop filter further includes a first capacitor between the first input of the operational amplifier and a ground reference voltage and a second capacitor between the output of the operational amplifier and the ground reference voltage.

21. A phase locked loop comprising:
a phase detector that receives a reference clock signal and a feedback clock signal, compares a difference in phase between the reference clock signal and the feedback clock signal, and generates first and second control signals in response to the comparison;
a first charge pump that receives the first and second control signals and that, in response, generates a first charge pump signal;
a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period;
a second charge pump that receives the first and second auxiliary control signals and, in response, generates an auxiliary charge pump signal;
a loop filter that receives the first charge pump signal and, in response, generates a control voltage, the loop filter comprising an operational amplifier having a first input that receives in combination the first charge pump signal and the auxiliary charge pump signal, second and third inputs that receive the first and second control signals respectively, and a fourth input that receives the control voltage, and an output that generates the control voltage in response to the signals provided at the first, second, third and fourth inputs; and
a voltage controlled oscillator that receives the control voltage signal and, in response, generates the reference clock signal.

22. The phase locked loop of claim 21 further comprising a control signal generator that receives the first and second auxiliary control signals and if either of the first and second auxiliary control signals is active, generates a third control signal, and wherein the operational amplifier includes a fifth input that receives the third control signal, and generates the control voltage further in response to the third control signal.

23. The phase locked loop of claim 22 wherein the control signal generator comprises an OR gate, a first input of which receives the first auxiliary control signal, a second input of which receives the second auxiliary control signal, and an output of which generates the third control signal.

24. The phase locked loop of claim 21 wherein the first control signal comprises an up control signal and wherein the second control signal comprises a down control signal.

25. The phase locked loop of claim 24 wherein the first control signal is activated in response to the rising edge of the reference clock signal and the second control signal is activated in response to the rising edge of the feedback clock signal.

26. The phase locked loop of claim 21 wherein when the phase locked loop operates in a first mode of operation, the reference clock signal and the feedback clock signal are substantially locked and when the phase locked loop operates in a second mode of operation, the reference clock signal and the feedback clock signal are out of phase by at least a predetermined amount; and wherein, when the phase locked loop operates in the first mode, the first charge pump is active and the second charge pump is inactive; and when the phase locked loop operates in the second mode of operation, the first charge pump is active and the second charge pump is active.

27. A phase locked loop comprising:
a phase detector that receives a reference clock signal and a feedback clock signal, compares a difference in phase of the reference clock signal and the feedback clock signal, and generates first and second control signals in response to the comparison;
a first charge pump that receives the first and second control signals and that, in response, generates a first charge pump signal;
a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period;
a second charge pump that receives the first and second auxiliary control signals and, in response, generates a second charge pump signal;
a third charge pump that receives the first and second control signals and, in response, generates a third charge pump signal;

a fourth charge pump that receives the first and second control signals and the first and second auxiliary control signals and, in response, generates a fourth charge pump signal;

a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and a voltage controlled oscillator that receives the control voltage signal and, in response, generates the reference clock signal.

28. The phase locked loop of claim 27 wherein when the phase locked loop operates in a first mode of operation, the reference clock signal and the feedback clock signal are substantially locked and when the phase locked loop operates in a second mode of operation, the reference clock signal and the feedback clock signal are out of phase by at least a predetermined amount; and wherein, when the phase locked loop operates in the first mode, the first charge pump, third charge pump and fourth charge pump are active and the second charge pump is inactive; and when the phase locked loop operates in the second mode of operation, the first charge pump, second charge pump and third charge pump are active and the fourth charge pump is inactive.

29. The phase locked loop of claim 27 wherein the first charge pump comprises a first current source and a first charge pump transistor in series between a first voltage supply and a first node, and a second charge pump transistor and a second current source in series between the first node and a ground reference voltage, the first charge pump transistor being activated in response to the first control signal and the second charge pump transistor being activated in response to the second control signal, the first charge pump providing the first charge pump signal at the first node.

30. The phase locked loop of claim 27 wherein the second charge pump comprises a third current source and a third charge pump transistor in series between a first voltage supply and a second node, and a fourth charge pump transistor and a fourth current source in series between the second node and a ground reference voltage, the third charge pump transistor being activated in response to the first auxiliary control signal and the second charge pump transistor being activated in response to the second auxiliary control signal, the second charge pump providing the second charge pump signal at the second node.

31. The phase locked loop of claim 27 wherein the third charge pump comprises a fifth current source and a fifth charge pump transistor in series between a first voltage supply and a third node, and a sixth charge pump transistor and a sixth current source in series between the third node and a ground reference voltage, the fifth charge pump transistor being activated in response to the first control signal and the sixth charge pump transistor being activated in response to the second control signal, the third charge pump providing the third charge pump signal at the third node.

32. The phase locked loop of claim 27 wherein the fourth charge pump comprises a seventh current source and seventh and eighth charge pump transistors in series between a first voltage supply and a fourth node, and ninth and tenth charge pump transistors and an eighth current source in series between the third node and a ground reference voltage, the seventh charge pump transistor being activated in response to the first control signal, the eighth charge pump transistor being activated in response to the first auxiliary control signal, the ninth charge pump transistor being activated in response to the second auxiliary control signal and the tenth charge pump transistor being activated in response to the second control signal, the fourth charge pump providing the fourth charge pump signal at the fourth node.

33. A memory device comprising:

a plurality of addressable memory cells, each cell comprising a data storage element;

a decoder that receives an address from an external source, and that generates a row signal and a column signal for accessing at least one of the addressable memory cells; and a phase locked loop comprising:

a first charge pump that receives first and second control signals generated in response to a comparison of phases of a reference clock signal and a feedback signal and that, in response, generates a first charge pump signal;

a loop filter comprising an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs; and a voltage controlled oscillator that receives the control voltage signal and, in response, generates the feedback clock signal.

34. The memory device of claim 33 wherein the operational amplifier of the loop filter comprises a first operational amplifier and wherein the control voltage generated by the first operational amplifier comprises a first control voltage, and further comprising a second operational amplifier that receives the first control voltage at a first input and that generates a second control voltage that is provided to the voltage controlled oscillator, a second input of the second operational amplifier receiving the second control voltage via a feedback path.

35. The memory device of claim 33 further comprising:

a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and a second charge pump that receives the first and second auxiliary control signals and, in response, generates an auxiliary charge pump signal, the auxiliary charge pump signal being applied to the first input of the operational amplifier in combination with the first charge pump signal.

36. The memory device of claim 35 further comprising a control signal generator that receives the first and second auxiliary control signals and that, if either of the first and second auxiliary control signals is active, generates a third control signal, and wherein the operational amplifier includes a fifth input that receives the third control signal, and generates the control voltage further in response to the third control signal.

37. A memory device comprising:

a plurality of addressable memory cells, each cell comprising a data storage element;

a decoder that receives an address from an external source, and that generates a row signal and a column signal for accessing at least one of the addressable memory cells; and
a phase locked loop comprising:
  a phase detector that receives a reference clock signal and a feedback clock signal, compares a difference in phase of the reference clock signal and the feedback clock signal, and generates first and second control signals in response to the comparison;
  a first charge pump that receives the first and second control signals and that, in response, generates a first charge pump signal;
  a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period;
  a second charge pump that receives the first and second auxiliary control signals and, in response, generates a second charge pump signal;
  a third charge pump that receives the first and second control signals and, in response, generates a third charge pump signal;
  a fourth charge pump that receives the first and second control signals and the first and second auxiliary control signals and, in response, generates a fourth charge pump signal;
  a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and
  a voltage controlled oscillator that receives the control voltage signal and, in response, generates the reference clock signal.

38. A memory system comprising:
a memory controller that generates command and address signals; and
a memory module comprising a plurality of memory devices, the memory module receiving the command and address signals and in response storing and retrieving data to and from the memory device,
wherein each memory device comprises:
  a plurality of addressable memory cells, each cell comprising a data storage element;
  a decoder that receives an address from an external source, and that generates a row signal and a column signal for accessing at least one of the addressable memory cells; and
  a phase locked loop comprising:
    a first charge pump that receives first and second control signals generated in response to a comparison of phases of a reference clock signal and a feedback signal and that, in response, generates a first charge pump signal;
    a loop filter comprising an operational amplifier having a first input that receives the first charge pump signal, second and third inputs that receive the first and second control signals respectively, and a fourth input that receives a control voltage, and an output that generates the control voltage in response to the signals provided at the first, second, third and fourth inputs; and
    a voltage controlled oscillator that receives the control voltage signal and, in response, generates the feedback clock signal.

39. The memory system of claim 38 wherein the operational amplifier of the loop filter comprises a first operational amplifier and wherein the control voltage generated by the first operational amplifier comprises a first control voltage, and further comprising a second operational amplifier that receives the first control voltage at a first input and that generates a second control voltage that is provided to the voltage controlled oscillator, a second input of the second operational amplifier receiving the second control voltage via a feedback path.

40. The memory system of claim 38 further comprising:
a pulse width filter that receives the first control signal, and in response, generates a first auxiliary control signal when the first control signal is active for greater than a first predetermined time period; and that receives the second control signal, and in response, generates a second auxiliary control signal when the second control signal is active for greater than a second predetermined time period; and
a second charge pump that receives the first and second auxiliary control signals and, in response, generates an auxiliary charge pump signal, the auxiliary charge pump signal being applied to the first input of the operational amplifier in combination with the first charge pump signal.

41. The memory system of claim 40 further comprising a control signal generator that receives the first and second auxiliary control signals and that, if either of the first and second auxiliary control signals is active, generates a third control signal, and wherein the operational amplifier includes a fifth input that receives the third control signal, and generates the control voltage further in response to the third control signal.

42. A memory system comprising:
a memory controller that generates command and address signals; and
a memory module comprising a plurality of memory devices, the memory module receiving the command and address signals and in response storing and retrieving data to and from the memory device,
wherein each memory device comprises:
  a plurality of addressable memory cells, each cell comprising a data storage element;
  a decoder that receives an address from an external source, and that generates a row signal and a column signal for accessing at least one of the addressable memory cells; and
  a phase locked loop comprising:
    a phase detector that receives a reference clock signal and a feedback clock signal, compares a difference in phase of the reference clock signal and the feedback clock signal, and generates first and second control signals in response to the comparison;
    a first charge pump that receives the first and second control signals and that, in response, generates a first charge pump signal;
    a pulse width filter that receives the first control signal, and in response, generates a first auxiliary control signal when the first control signal is active for greater than a first predetermined time period, and that receives the second control signal, and in response, generates a second auxiliary control signal when the second control signal is active for greater than a second predetermined time period;

a second charge pump that receives the first and second auxiliary control signals and, in response, generates a second charge pump signal;

a third charge pump that receives the first and second control signals and, in response, generates a third charge pump signal;

a fourth charge pump that receives the first and second control signals and the first and second auxiliary control signals and, in response, generates a fourth charge pump signal;

a loop filter comprising an operational amplifier having a first input that receives in combination the first charge pump signal and the second charge pump signal, having a second input that receives in combination the third charge pump signal, the fourth charge pump signal and a control voltage signal, and having an output that generates the control voltage signal in response to the signals provided at the first and second inputs; and a voltage controlled oscillator that receives the control voltage signal and, in response, generates the reference clock signal.

43. A method comprising:

receiving at a first charge pump first and second control signals generated in response to a comparison of phases of a reference clock signal and a feedback signal and, in response, generating a first charge pump signal;

receiving at an operational amplifier the first charge pump signal at a first input, receiving the first and second control signals respectively at second and third inputs of the operational amplifier, and receiving a control voltage at a fourth input of the operational amplifier, and generating, at an output of the operational amplifier, the control voltage in response to the signals provided at the first, second, third and fourth inputs; and receiving the control voltage signal at a voltage controlled oscillator, and, in response, generating the feedback clock signal.

44. The method of claim 43 wherein the operational amplifier comprises a first operational amplifier and wherein the control voltage generated by the first operational amplifier comprises a first control voltage, and further comprising receiving at a second operational amplifier the first control voltage at a first input and generating a second control voltage that is provided to the voltage controlled oscillator, a second input of the second operational amplifier receiving the second control voltage via a feedback path.

45. The method of claim 43 further comprising:

receiving at a pulse width filter the first control signal, and in response, generating a first auxiliary control signal when the first control signal is active for greater than a first predetermined time period; and receiving at the pulse width filter the second control signal, and in response, generating a second auxiliary control signal when the second control signal is active for greater than a second predetermined time period; and receiving at a second charge pump the first and second auxiliary control signals and, in response, generating an auxiliary charge pump signal, the auxiliary charge pump signal being applied to the first input of the operational amplifier in combination with the first charge pump signal.

46. The method of claim 45 further comprising receiving at a control signal generator the first and second auxiliary control signals and, if either of the first and second auxiliary control signals is active, generating a third control signal, and receiving at a fifth input of the operational amplifier the third control signal, and generating at the output of the operational amplifier the control voltage further in response to the third control signal.

47. A method comprising:

receiving at a phase detector, a reference clock signal and a feedback clock signal, comparing a difference in phase of the reference clock signal and the feedback clock signal, and generating first and second control signals in response to the comparison;

receiving at a first charge pump the first and second control signals and, in response, generating a first charge pump signal;

receiving at a pulse width filter the first control signal, and in response, generating a first auxiliary control signal when the first control signal is active for greater than a first predetermined time period, and receiving the second control signal, and in response, generating a second auxiliary control signal when the second control signal is active for greater than a second predetermined time period;

receiving at a second charge pump the first and second auxiliary control signals and, in response, generating a second charge pump signal;

receiving at a third charge pump the first and second control signals and, in response, generating a third charge pump signal;

receiving at a fourth charge pump the first and second control signals and the first and second auxiliary control signals and, in response, generating a fourth charge pump signal;

receiving at a loop filter comprising an operational amplifier in combination at a first input the first charge pump signal and the second charge pump signal, receiving in combination at a second input the third charge pump signal, the fourth charge pump signal and a control voltage signal, and generating at an output the control voltage signal in response to the signals provided at the first and second inputs; and receiving at a voltage controlled oscillator the control voltage signal and, in response, generating the reference clock signal.

* * * * *